United States Patent
Sudo et al.

(10) Patent No.: US 9,809,902 B2
(45) Date of Patent: *Nov. 7, 2017

(54) METHOD FOR EVALUATING SILICA GLASS CRUCIBLE, METHOD FOR PRODUCING SILICON SINGLE CRYSTALS

(71) Applicant: SUMCO CORPORATION, Minato-ku, Tokyo (JP)

(72) Inventors: Toshiaki Sudo, Akita (JP); Tadahiro Sato, Akita (JP); Ken Kitahara, Akita (JP); Eriko Kitahara, Akita (KR); Makiko Kodama, Akita (JP)

(73) Assignee: SUMCO CORPORATION, Tokyo (JP)

( * ) Notice: Subject to any disclaimer, the term of this patent is extended or adjusted under 35 U.S.C. 154(b) by 342 days.

This patent is subject to a terminal disclaimer.

(21) Appl. No.: 14/365,523

(22) PCT Filed: Oct. 31, 2012

(86) PCT No.: PCT/JP2012/078260
§ 371 (c)(1),
(2) Date: Jun. 13, 2014

(87) PCT Pub. No.: WO2013/094318
PCT Pub. Date: Jun. 27, 2013

(65) Prior Publication Data
US 2014/0326172 A1    Nov. 6, 2014

(30) Foreign Application Priority Data

Dec. 22, 2011   (JP) .................................. 2011-282404
Dec. 22, 2011   (JP) .................................. 2011-282406
(Continued)

(51) Int. Cl.
*C30B 15/26*   (2006.01)
*C30B 29/06*   (2006.01)
(Continued)

(52) U.S. Cl.
CPC .............. *C30B 15/26* (2013.01); *C30B 15/10* (2013.01); *C30B 29/06* (2013.01); *G01B 11/005* (2013.01);
(Continued)

(58) Field of Classification Search
CPC ......... C30B 15/10; C30B 15/20; C30B 15/26; G01B 11/24
See application file for complete search history.

(56) References Cited

U.S. PATENT DOCUMENTS 6,652,934 B1 *  11/2003  Miyao ................... C03B 19/095
                                                      428/34.4
8,257,496 B1 *   9/2012  Bender .................. C30B 15/02
                                                      117/13
(Continued)

FOREIGN PATENT DOCUMENTS

JP         08208376 A  *   8/1996
JP         H08-278117 A     10/1996
(Continued)

OTHER PUBLICATIONS

Japan Platform for Patent information, English computer translation of JP 08-208376 A (2016).*
(Continued)

*Primary Examiner* — Matthew Song
(74) *Attorney, Agent, or Firm* — Law Office of Katushiro Arai

(57) ABSTRACT

The present invention provides a method for evaluating a vitreous silica crucible which can measure a three-dimensional shape of the inner surface of the crucible in a non-destructive manner. According to the present invention, A method for evaluating a vitreous silica crucible, including the steps of: moving an internal ranging section along an inner surface of the vitreous silica crucible in a contactless (Continued)

manner; measuring a distance between the internal ranging section and the inner surface as a distance from the inner surface, by subjecting the inner surface of the crucible to irradiation with laser light and then detecting a reflected light from the inner surface, the laser light being emitted from the internal ranging section in an oblique direction with respect to the inner surface, and the measurement being conducted at a plurality of measuring points along a course of a movement of the internal ranging section; and obtaining a three-dimensional shape of the inner surface of the crucible, by associating three-dimensional coordinates of each of the measuring points with the distance from the inner surface, is provided.

21 Claims, 9 Drawing Sheets

(30) Foreign Application Priority Data

| Dec. 22, 2011 | (JP) | 2011-282408 |
|---|---|---|
| Dec. 22, 2011 | (JP) | 2011-282409 |
| Dec. 22, 2011 | (JP) | 2011-282410 |
| Dec. 22, 2011 | (JP) | 2011-282411 |
| Dec. 22, 2011 | (JP) | 2011-282412 |

(51) Int. Cl.

| G01B 11/00 | (2006.01) |
|---|---|
| C30B 15/10 | (2006.01) |
| G01B 11/06 | (2006.01) |
| G01B 11/245 | (2006.01) |
| G01B 11/24 | (2006.01) |
| G01J 3/42 | (2006.01) |
| G01J 5/58 | (2006.01) |

(52) U.S. Cl.
CPC .............. *G01B 11/06* (2013.01); *G01B 11/24* (2013.01); *G01B 11/245* (2013.01); *G01J 3/42* (2013.01); *G01J 5/58* (2013.01)

(56) References Cited

U.S. PATENT DOCUMENTS

| 2005/0102061 A1* | 5/2005 | Lent ........................ C22B 11/00 700/245 |
|---|---|---|
| 2006/0174822 A1* | 8/2006 | Sumiya ................. C30B 11/002 117/81 |
| 2007/0195311 A1* | 8/2007 | Morgan .................... A61F 2/16 356/124 |
| 2008/0250659 A1* | 10/2008 | Bellerose ............. G05B 19/402 33/1 MP |
| 2010/0251959 A1 | 10/2010 | Kodama et al. |
| 2010/0319613 A1 | 12/2010 | Fujiwara et al. |
| 2011/0017128 A1* | 1/2011 | Harada ................. C03B 19/095 117/208 |
| 2015/0007764 A1* | 1/2015 | Sudo ....................... C30B 15/10 117/15 |

FOREIGN PATENT DOCUMENTS

| JP | H09-196646 A | 7/1997 |
|---|---|---|
| JP | H10-185545 A | 7/1998 |
| JP | H10-185546 A | 7/1998 |
| JP | H11-292694 A | 10/1999 |
| JP | 2000-16820 A | 1/2000 |
| JP | 2001-048693 A | 2/2001 |
| JP | 2001-261353 A | 9/2001 |
| JP | 2004-271247 A | 9/2004 |
| JP | 2005-97050 A | 4/2005 |
| JP | 2006-096618 A | 4/2006 |
| JP | 2010-241623 A | 10/2010 |
| WO | 2009104532 A1 | 8/2009 |

OTHER PUBLICATIONS

International Search Report for PCT/JP2012/078260; dated Feb. 5, 2013.

* cited by examiner

[FIG. 1]
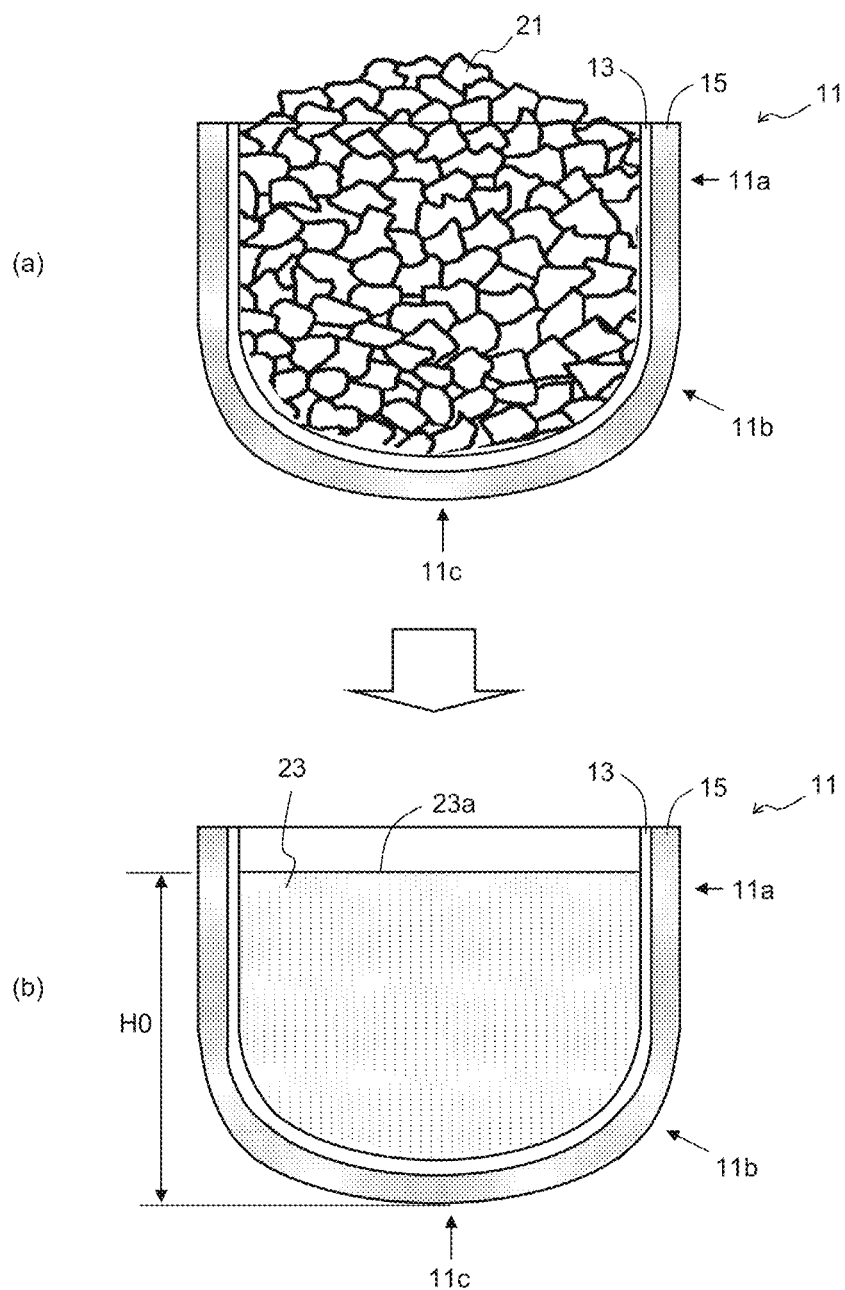

[FIG. 2]
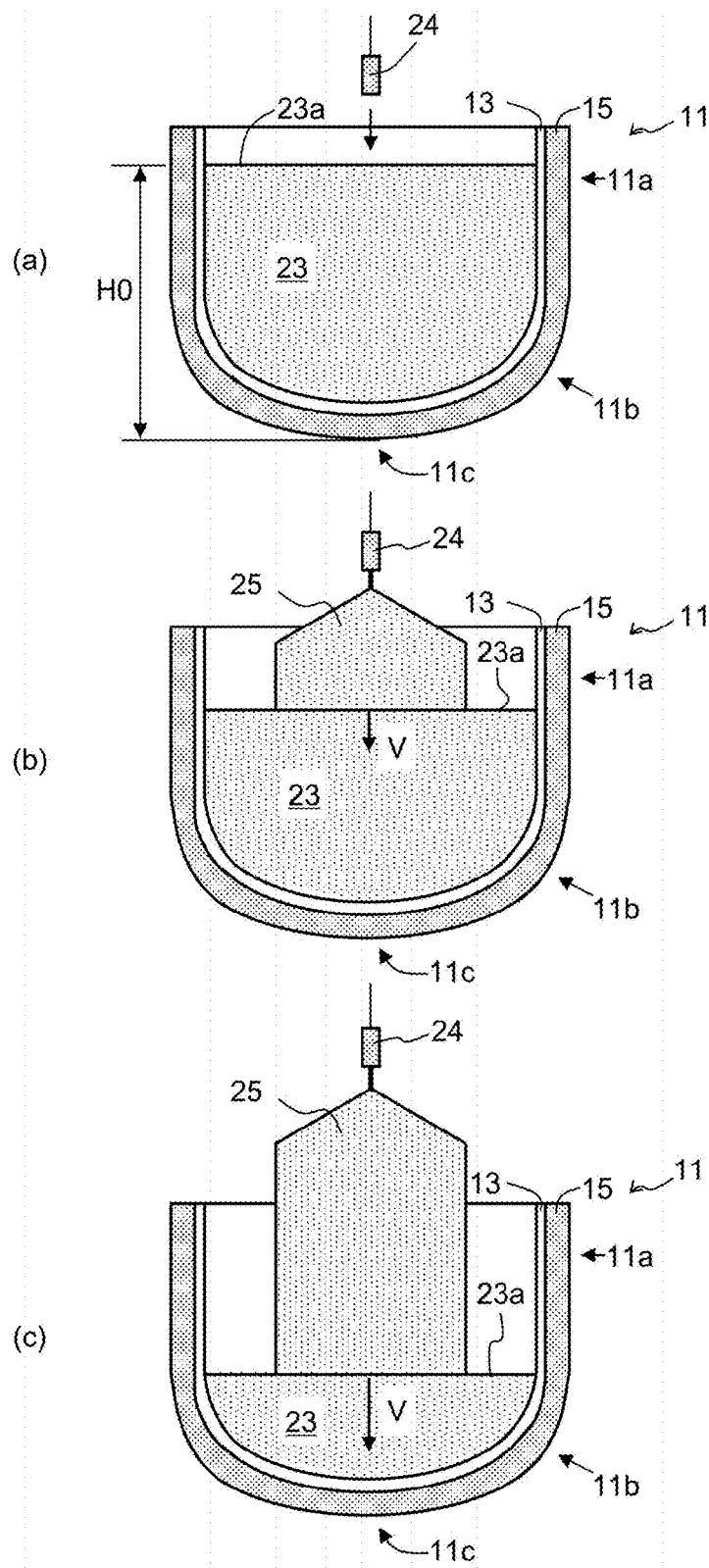

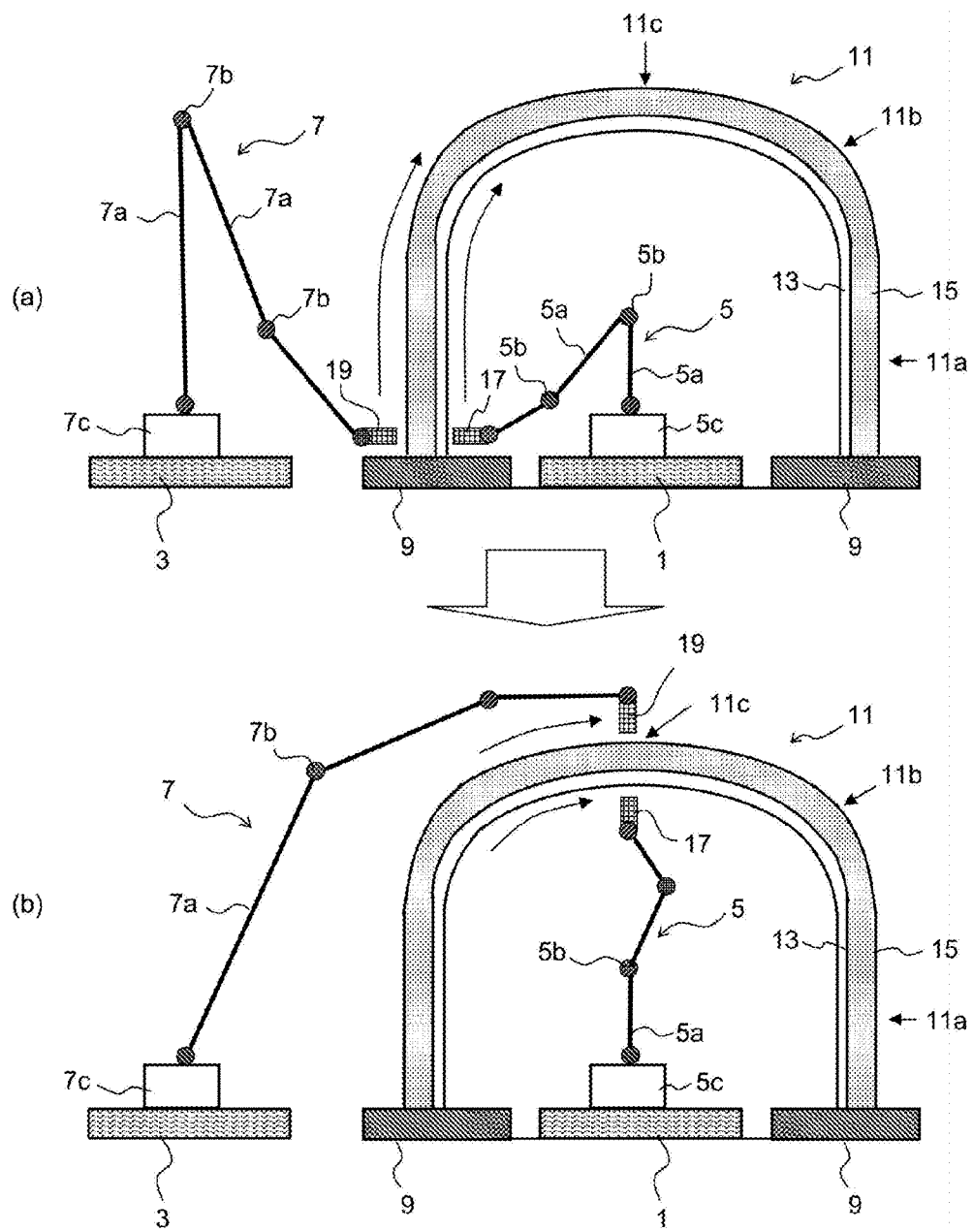
[FIG. 3]

[FIG. 4]
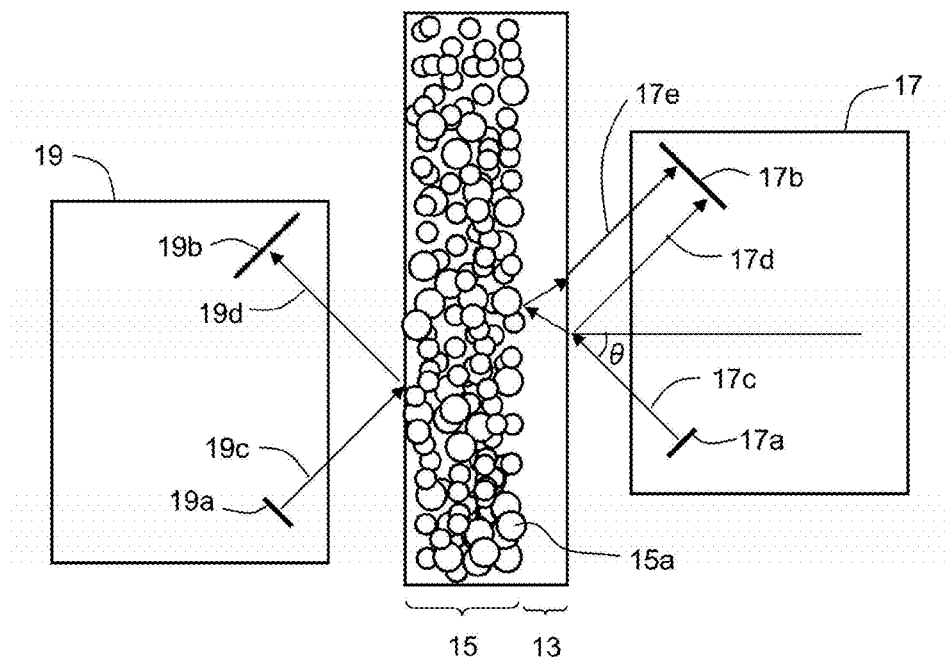
[FIG. 5]
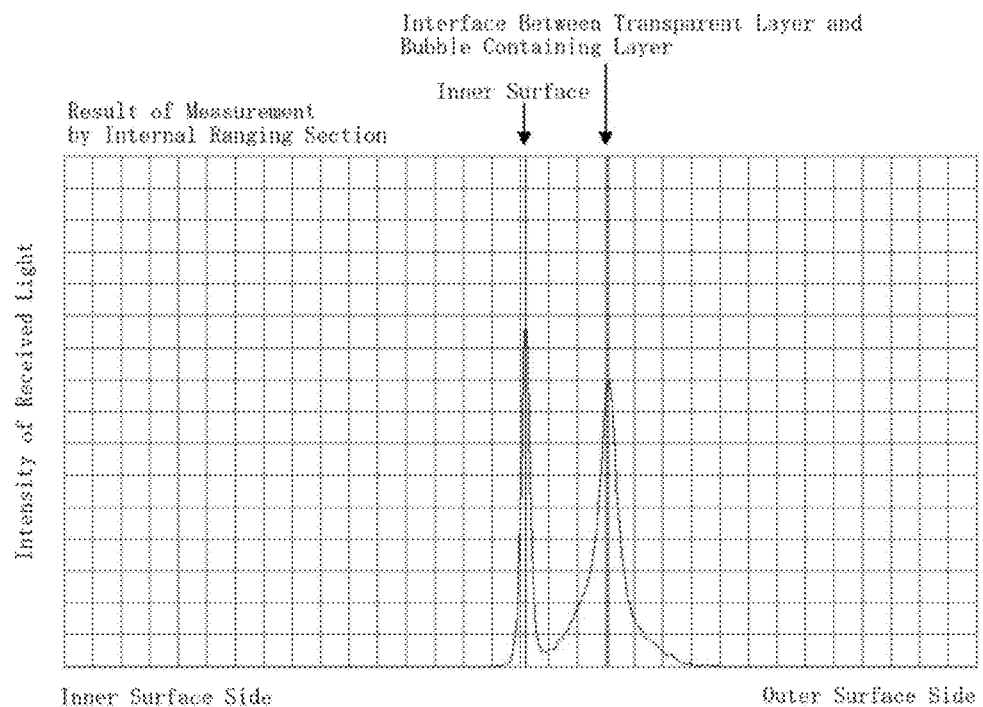

[FIG. 6]
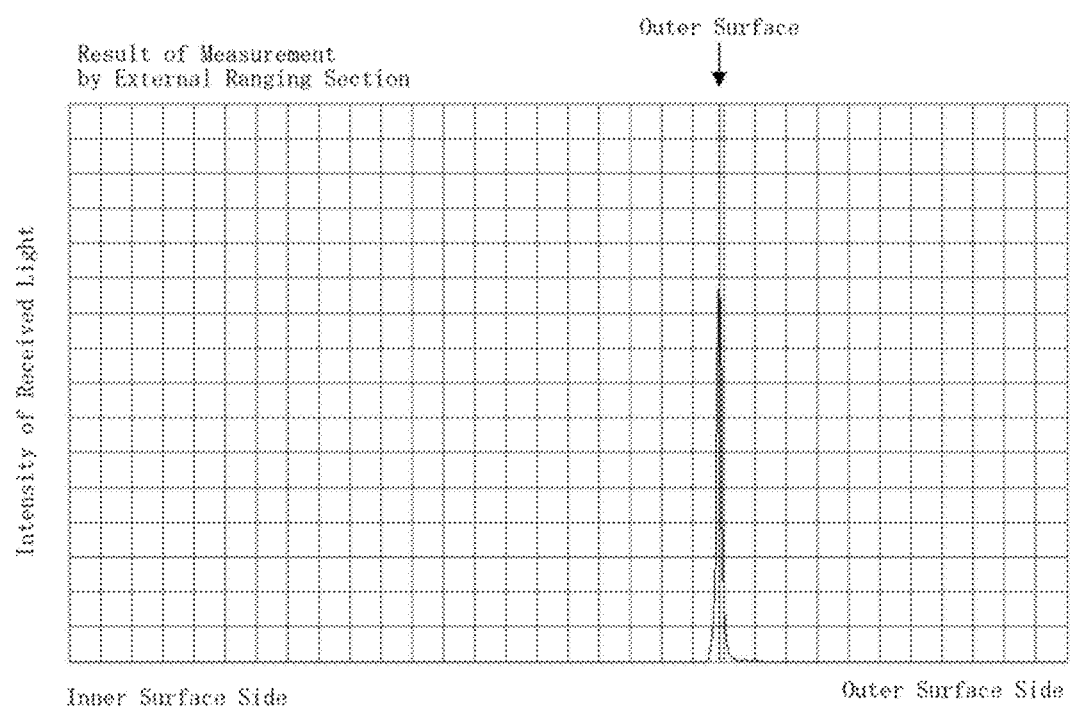

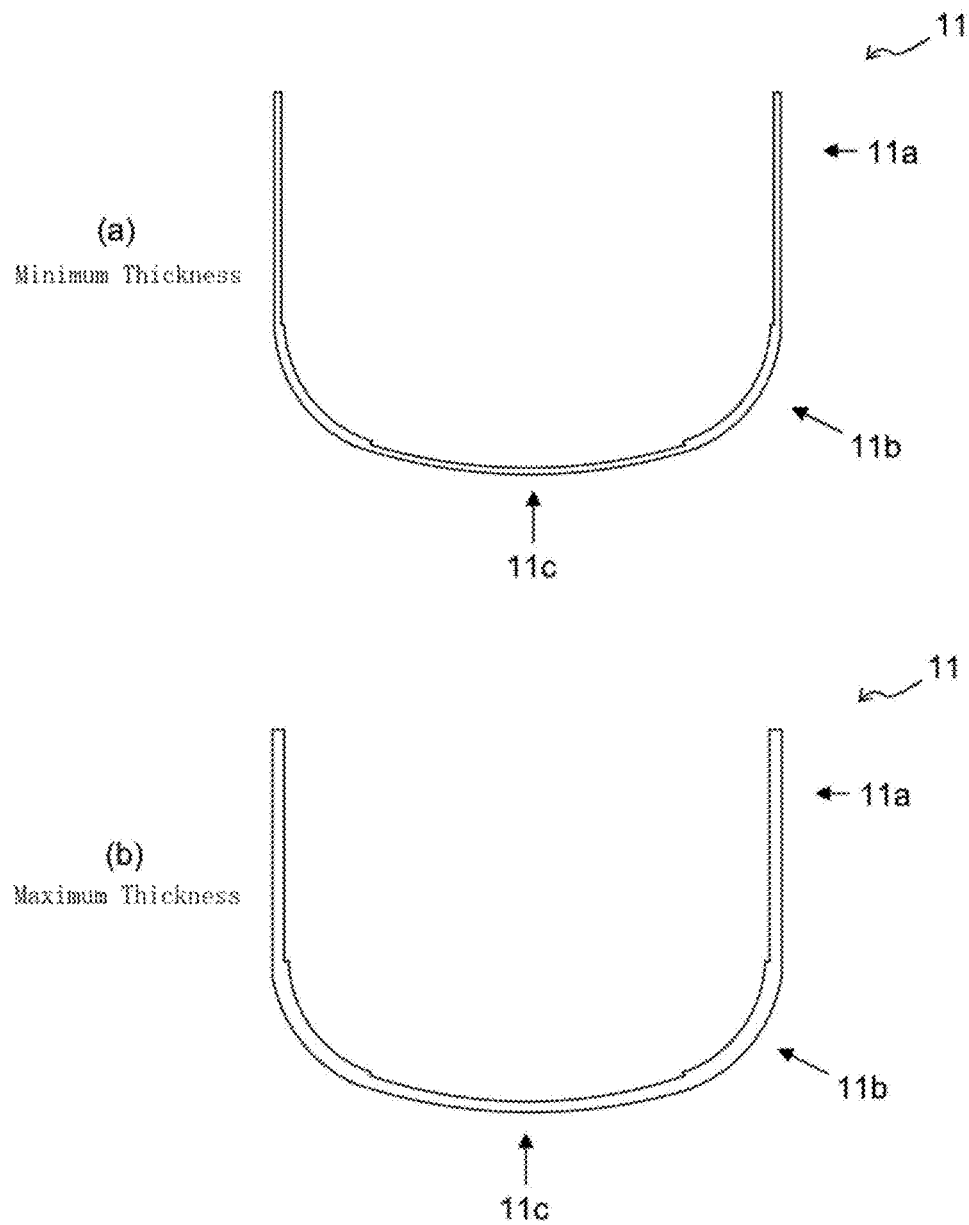

[FIG. 8]
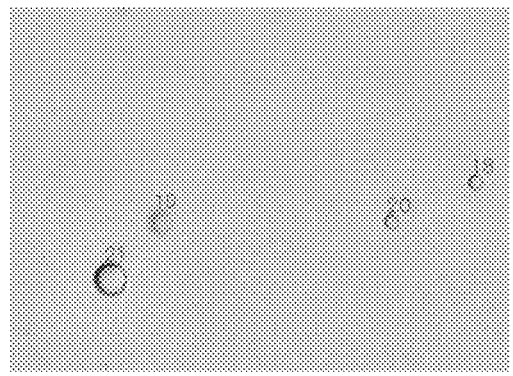
[FIG. 9]
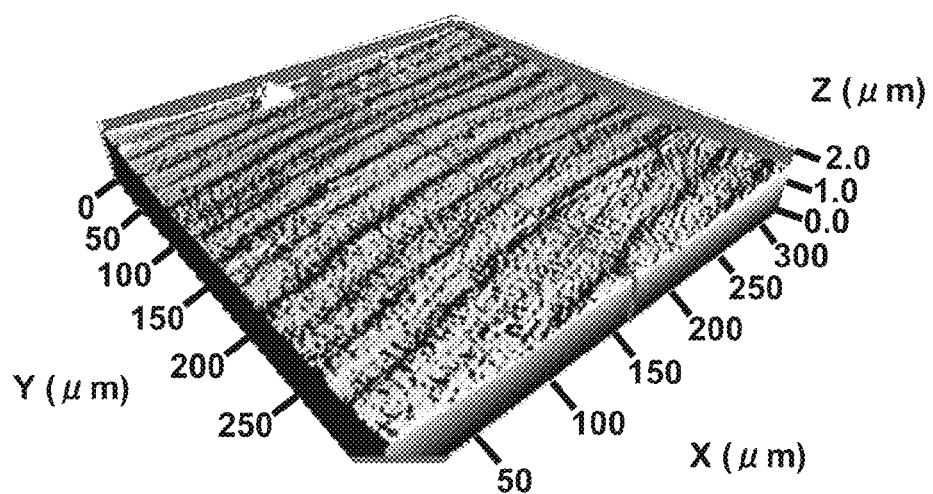
[FIG. 10]
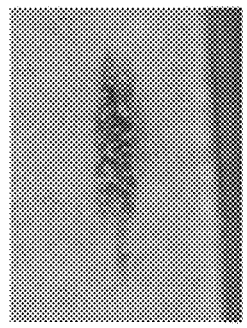

[FIG. 11]
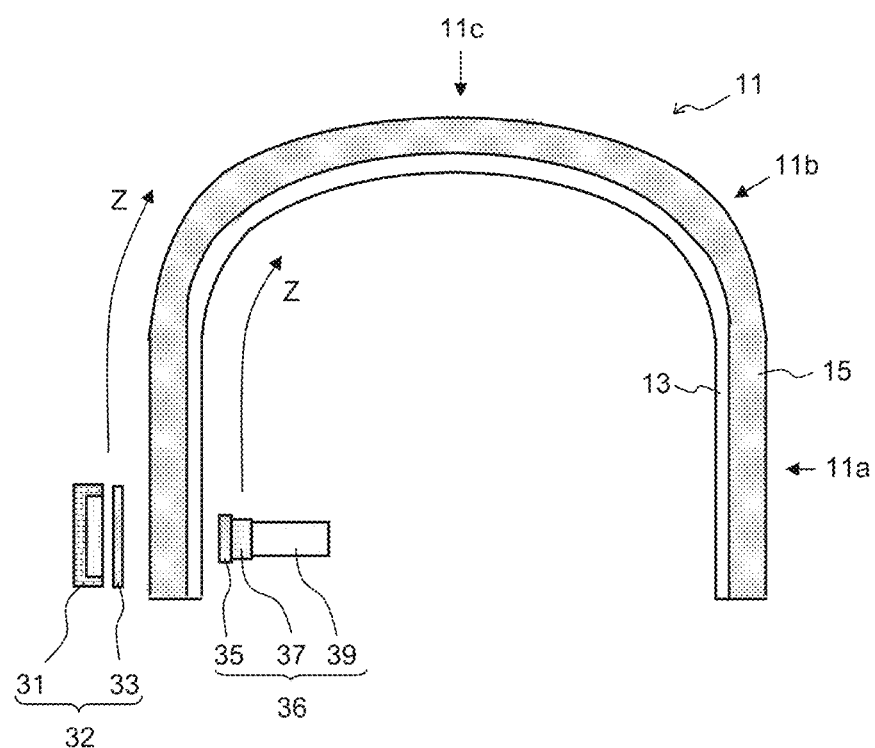

[FIG. 12]
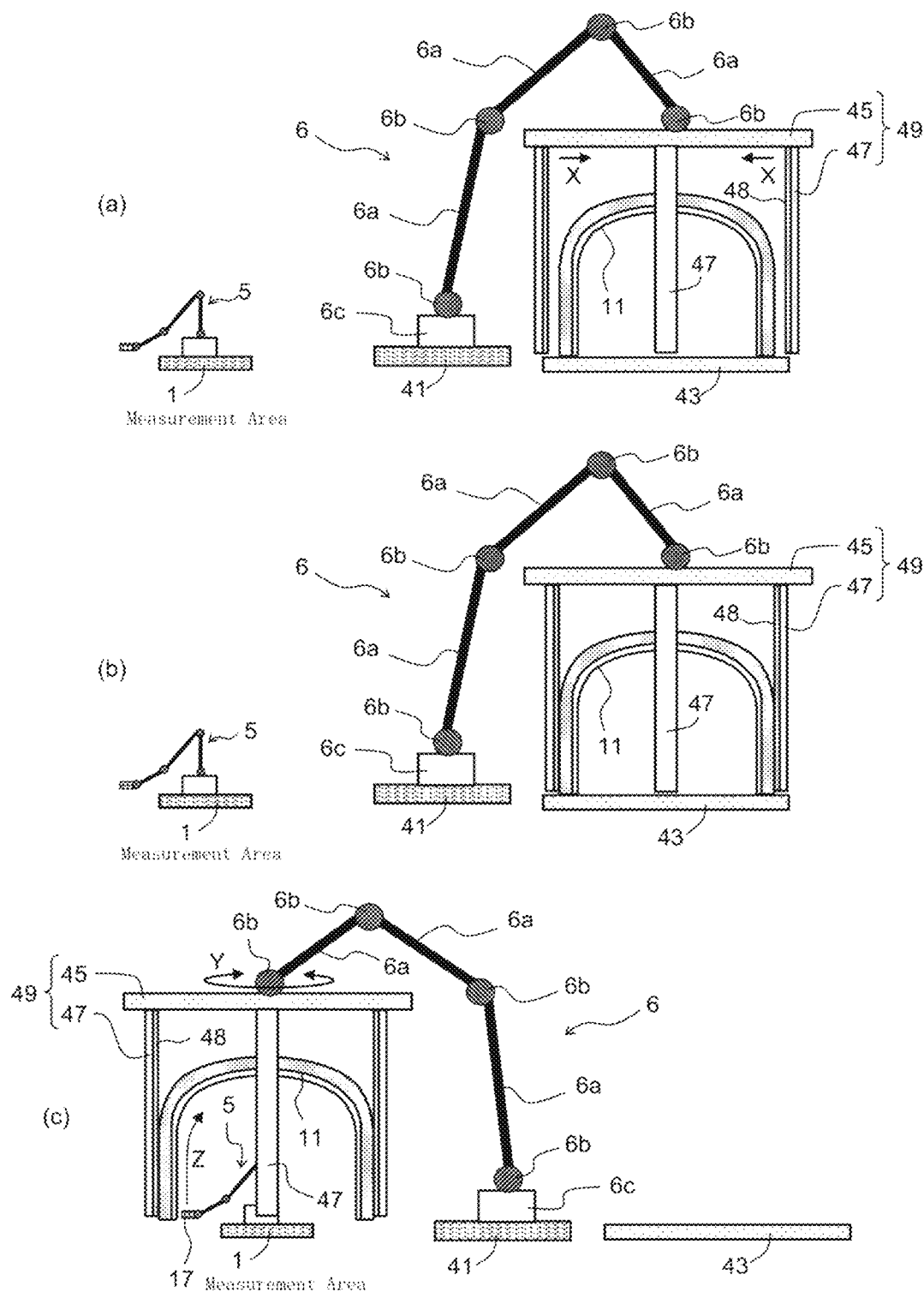

METHOD FOR EVALUATING SILICA GLASS CRUCIBLE, METHOD FOR PRODUCING SILICON SINGLE CRYSTALS

This application is the U.S. National Phase under 35 U.S.C. §371 of International Application PCT/JP2012/078260, filed Oct. 31, 2012, which claims priority to Japanese Patent Applications No. 2011-282404, filed Dec. 22, 2011; No. 2011-282406, filed Dec. 22, 2011; No. 2011-282408, filed Dec. 22, 2011; No. 2011-282409, filed Dec. 22, 2011; No. 2011-282410, filed Dec. 22, 2011; No. 2011-282411, filed Dec. 22, 2011; and No. 2011-282412, filed Dec. 22, 2011. The International Application was published under PCT Article 21(2) in a language other than English.

TECHNICAL FIELD

The present invention relates to a method for evaluating a vitreous silica crucible, and to a manufacturing method of a monocrystalline silicon.

BACKGROUND ART

A monocrystalline silicon has been manufactured by the Czochralski method (the CZ method) using a vitreous silica crucible. In particular, a silicon melt obtained by melting polycrystalline silicon raw material is retained in the vitreous silica crucible, and then the silicon melt is allowed to come in contact with a seed crystal of a monocrystalline silicon, followed by gradual pulling of the seed crystal while rotating the seed crystal. Thus, the monocrystalline silicon is manufactured by allowing the single crystal to grow with the seed crystal acting as a core. The softening point of the vitreous silica is approximately 1200 to 1300° C., while the pulling temperature of the monocrystalline silicon is 1450 to 1500° C., which is an extremely high temperature above the softening point of the monocrystalline silicon. In addition, the time required for the pulling may exceed two weeks.

The monocrystalline silicon being pulled is required to have a purity of 99.999999999% or higher, and thus the vitreous silica crucible used for the pulling is also required to have high purity.

The diameter size of the vitreous silica crucible varies as 28 inches (approximately 71 cm), 32 inches (approximately 81 cm), 36 inch (approximately 91 cm), 40 inches (approximately 101 cm), and the like. The crucible with the diameter of 101 cm is huge, with its weight being approximately 120 kg. The weight of the silicon melt being retained therein is 900 kg or more. Accordingly, when pulling the monocrystalline silicon, 900 kg or more of the silicone melt at approximately 1500° C. is retained in the crucible.

A manufacturing method of a vitreous silica crucible used when pulling a monocrystalline silicon generally includes a silica powder layer forming step to form a silica powder layer by depositing the silica powder having an average particle diameter of approximately 300 μm onto the inner surface of a rotating mold; an arc fusing step to form a vitreous silica layer by arc fusing the silica powder layer while depressurizing the silica powder layer from the mold side (hereinafter referred to as a "rotating mold method"). During the early stage of the arc fusing step, the silica powder layer is strongly depressurized, thereby removing bubbles to form a transparent vitreous silica layer (hereinafter referred to as "transparent layer"). Then, the degree of depressurizing is weakened to form a bubble containing vitreous silica layer (hereinafter referred to as "bubble containing layer"), with remaining bubbles. Accordingly, a vitreous silica crucible having a two-layer structure, with the transparent layer at the inner surface side and the bubble containing layer at the outer surface side, can be formed.

As the silica powder used for the manufacture of the crucible, natural silica powder manufactured by pulverizing natural quartz, and synthetic silica powder manufactured by chemical synthesis can be mentioned. Here, physical property, shape, and size of natural silica powder tend to vary since the raw material of the natural silica powder is a natural product. When the physical property, shape, or size varies, the fused state of the silica powder varies, and thus the shape of the inner surface, condition of the inner surface, distribution of the bubbles, thickness of the transparent layer and the like of the crucible being manufactured would vary for each of the crucibles, or may vary within the crucible among the portions of the crucible, even when the arc fusing is conducted under the same conditions.

As a device for measuring the shape of a vitreous silica crucible, the ones disclosed in Patent Documents 1 and 2 have been known. By the devices disclosed in Patent Documents 1 and 2, height and outer diameter of the crucible are measured.

PRIOR ART REFERENCE

Patent Document

Patent Document 1: JP-A-10-185545
Patent Document 2: JP-A-10-185546
Patent Document 3: JP-A-2000-16820
Patent Document 4: JP-A-2001-261353
Patent Document 5: JP-A-2010-241623
Patent Document 6: JP-A-11-292694
Patent Document 7: JP-A-2005-97050
Patent Document 8: WO 2009/104532

SUMMARY OF THE INVENTION

Problems to be Solved by the Inventions

When the devices disclosed in Patent Documents 1 and are used, the height and the outer diameter of the crucible can be measured, however, these devices cannot be used for measuring the three-dimensional shape of the inner surface of the crucible.

The present invention has been made in view of such circumstances, and provides a method for evaluating a vitreous silica crucible which allows a non-destructive measurement of the three-dimensional shape of the inner surface of the crucible.

Means for Solving the Problems

According to the present invention, a method for evaluating a vitreous silica crucible, comprising the steps of:
moving an internal ranging section along an inner surface of the vitreous silica crucible in a contactless manner;
measuring a distance between the internal ranging section and the inner surface as a distance from the inner surface, by subjecting the inner surface of the crucible to irradiation with laser light and then detecting a reflected light from the inner surface, the laser light being emitted from the internal ranging section in an oblique direction with respect to the inner surface, and the measurement being conducted at a plurality of measuring points along a course of a movement of the internal ranging section; and obtaining a three-dimensional shape of the inner surface of the crucible, by associating three-dimensional coordinates of each of the measuring points with the distance from the inner surface, is provided.

The present inventors have thought that it is essential to obtain data of the three-dimensional shape of the inner surface and the three-dimensional distribution of the thickness of the transparent layer of the crucible in order to improve the performance of the crucible or to facilitate the quality control. However, it was difficult to measure the three-dimensional shape of the crucible by optical methods, since the crucible has a transparent body. The present inventors have tried a method of obtaining an image of the crucible by irradiating the inner surface of the crucible with light, and then analyzing the obtained image. However, analysis of the image required such long time it was impractical for using it in the measurement of the three-dimensional shape of the inner surface of the crucible entirely.

In such circumstances, the inventors of the present invention have found that when the laser light was emitted in an oblique direction with respect to the inner surface of the crucible, the reflected light from the inner surface of the crucible (light reflected by inner surface) can be detected.

Then, the light reflected by inner surface is detected by a different position of a detecting unit of the internal ranging section in accordance with the distance between the internal ranging section and the inner surface. This allows the measurement of the distance from inner surface, which is the distance between the internal ranging section and the inner surface, in accordance with the triangulation principle.

In addition, by carrying out the measurement at a plurality of measuring points along the inner surface of the crucible, the coordinates of the internal ranging section can be associated with the distance from inner surface to obtain the coordinates of the inner surface of the crucible that correspond to each of the measuring points.

Accordingly, by carrying out the measurement for each of the plurality of measuring points arranged as a mesh with 2 mm distance for example, coordinates of the inner surface can be obtained as a mesh. Thus, the three-dimensional shape of the inner surface of the crucible can be obtained.

The method according to the present invention is advantageous since the sampling rate of the data is greatly high compared with the method involving the analysis of the image. When a preliminary experiment was carried out for a crucible having a diameter of 1 m and 100,000 measuring points, the three-dimensional shape of the entire inner surface was measured in about 10 minutes.

Further, the superior point of the present invention is that the three-dimensional shape of the actual product can be obtained, since the three-dimensional shape of the entire inner surface of the crucible can be determined in a non-destructive manner. In the conventional method, the crucible was cut to prepare a sample, and the three-dimensional shape of this sample was measured. Accordingly, the conventional method was problematic in that the data cannot be obtained for the actual product, and the preparation of the sample required time and cost. Therefore, the present invention is advantageous since the three-dimensional shape of the actual product can be measured at low cost. In addition, the present invention is especially advantageous for huge crucibles with an outer diameter of 28 inches or 32 inches more, and extra-huge crucibles with an outer diameter of 40 inches or more. This is since the time and cost required for preparing samples for these crucibles would be extremely long and high respectively, when compared with those for the small crucibles.

Further, the present invention is advantageous in that the three-dimensional shape of the inner surface of the crucible can be measured in a contactless manner. As described, manufacture of a monocrystalline silicon with extremely high purity of 99.999999999% or higher requires the inner surface of the crucible to be kept at high cleanliness. While the inner surface of the crucible gets easily contaminated in the contact process, the contactless process of the present invention can prevent the inner surface from getting contaminated.

Here, such vitreous silica crucibles are preferably used in the manufacture of a huge monocrystalline silicon ingot having a diameter of 200 to 450 mm (for example, 200 mm, 300 mm, 450 mm) and a length of 2 m or more. The monocrystalline silicon wafer manufactured from such huge ingot is used preferably for the manufacture of flash memory or DRAM.

The price of the flash memories and DRAM are dropping rapidly, and thus it is necessary to manufacture the huge monocrystalline silicon ingot with high quality at low cost. For this purpose, the huge crucible need be manufactured with high quality at low cost.

In addition, processes using wafers having a diameter of 300 mm are the mainstream, and processes using wafers having a diameter of 450 mm are now under development. Therefore, in order to stably manufacture wafers having a diameter of 450 mm, demand for huge crucibles with high quality is increasing.

In the present invention, the three-dimensional shape of the inner surface of the crucible is measured for its entire circumference. Therefore, according to the present invention, determination of whether the shape of the inner surface of the crucible manufactured is identical with its specifications can be made easily. Then, when the shape of the inner surface does not meet the specifications, the manufacturing conditions such as the arc fusing conditions can be altered. Accordingly, crucibles with high quality, of which shape of the inner surface being identical with the specifications, can be manufactured with high manufacturing yield.

In addition, if the three-dimensional shape of the inner surface can be obtained accurately, various measuring devices such as a camera, a microscope, a probe for measuring infrared absorption spectrum, a probe for measuring Raman spectrum and the like can be moved along the inner surface of the crucible for measurement, thereby allowing to obtain a three-dimensional distribution of various physical properties of the inner surface of the crucible. Conventionally, samples were cut out from the crucible to measure the various physical properties, however, such procedure cannot achieve a non-destructive measurement nor inspection for all crucibles. Therefore, improvement in the quality of the crucible was not accomplished. In the present invention, various physical properties can be measured by a non-destructive measurement for all of the crucibles. Therefore, when an odd data is obtained, investigation can be conducted right away, and its cause can be investigated easily. As described, the present invention has a technical significance in that non-destructive measurement can be conducted for all of the crucibles, which was impossible with the conventional techniques.

It is preferable to carry out the measurement of the three-dimensional shape and the measurement of the three-dimensional distribution of the various physical properties of the inner surface, by moving a tip of a robot arm along the inner surface of the crucible and thus carrying out the measurement at a plurality of points during its movement. The advantage of this method is that the coordinates of the measuring points can be obtained. If an operator moves the probe and carries out the measurement, accurate coordinates of the points of measurement cannot be obtained, and thus it is impossible to accurately understand to which of the measuring points does each of the measured value corresponds. If the robot arm is used, accurate coordinate can be obtained, and thus the obtained data can be more utilized.

The larger the crucible becomes, the more difficult its manufacture becomes. This phenomena can be easily understood when the difficulty of baking a pancake having a diameter of 50 cm and a thickness of 5 cm is compared with the easiness of baking a pancake having a diameter of 10 cm and a thickness of 1 cm. The difficulty of the former is extremely high. Pancakes of large size easily get burnt on its surface, or become under-cooked in the inside. In a similar manner, heat management during the manufacture of the huge crucible is more difficult than that for the small crucible. This leads to variation in the shape of the inner surface and the physical properties of the inner surface. Therefore, the necessity of measuring the three-dimensional shape of the inner surface and the three-dimensional distribution of the physical properties by using the method of the present invention is especially high for huge crucible.

In addition, when the monocrystalline silicon is pulled, the silicon melt is heated with a carbon heater and the like provided around the crucible in order to maintain the temperature of the silicon melt retained in the crucible at a high temperature of 1450 to 1500° C. When the crucible becomes huge, the distance between the carbon heater and the center of the crucible becomes long (when the radius of the crucible enlarges from 25 cm to 50 cm, the distance between the carbon heater and the center of the crucible is approximately doubled). Accordingly, in order to maintain the temperature of the silicon melt at the center of the crucible at a temperature higher than the melting point of silicon, the quantity of heat applied to the silicon melt from the carbon heater via the crucible becomes large. Therefore, when the crucible becomes huge, the quantity of heat applied to the crucible also becomes large, and thus problems such as the deformation of the crucible arise. Thus, the variation in the shape of the crucible and the physical properties of the inner surface arise problems when the monocrystalline silicon is pulled. This problem is seen more with huge crucibles than with small crucibles. Therefore, the necessity of measuring the three-dimensional shape of the inner surface and the three-dimensional distribution of the physical properties by using the method of the present invention is especially high with huge crucibles.

Here, since the weight of huge crucibles are 38 kg or more (for example, crucibles having a diameter of 71 cm weigh 39 kg, crucibles having a diameter of 81 cm weigh 59 kg, crucibles having a diameter of 91 cm weigh 77 kg, crucibles having a diameter of 101 cm weigh 121 kg), it is very difficult to handle them by man hand. In addition, in order to measure the three-dimensional shape of the inner surface around the crucible, it is necessary to rotate the crucible. However, it is difficult to rotate the crucible with man hand, and to obtain the rotation angle accurately when rotated with man hand. Accordingly, the present inventors have thought of holding the crucible with a robot arm for conveyance, and to carry out the measuring while holding. By using the robot arm for conveyance, heavy and fragile crucible can be conveyed easily and safely, and the crucible can be set at an accurate position of a measurement area. In addition, the crucible can be accurately rotated by 5 degrees for example, and thus the three-dimensional shape of the inner surface and the three-dimensional distribution of the physical properties can be measured accurately.

The area of the inner surface of the crucible is 14,400 $cm^2$ for the crucible having a diameter of 81 cm, 16,640 $cm^2$ for the crucible having a diameter of 91 cm, and 21,109 $cm^2$ for the crucible having a diameter of 101 cm. An image of the inner surface can be taken by moving the tip of an internal robot arm along the inner surface of the crucible. Here, if the size of an image is 4 cm×4 cm, the number of the images when the image of the entire inner surface is taken would be approximately 900 images for the crucible having a diameter of 81 cm, 1,000 images for the crucible having a diameter of 91 cm, and 1,300 images for the crucible having a diameter of 101 cm. Such number of images would be required for each of the crucibles. However, when the method of the present invention is used, images are taken by cooperating the internal robot arm and the robot arm for conveyance, and thus such a large number of images can be taken in comparatively short time.

Hereinafter, specific embodiments of the present invention will be described.

<Measurement of the Three-Dimensional Shape of the Interface of the Crucible>

Preferably, the crucible comprises a transparent vitreous silica layer at an inner surface side, and a bubble containing layer at an outer surface side, and the method further comprises the steps of:

measuring a distance between the internal ranging section and an interface as a distance from interface by detecting light reflected by interface with the internal ranging section, the interface being an interface between the transparent vitreous silica layer and the bubble containing layer; and obtaining a three-dimensional shape of the interface by associating three-dimensional coordinates of each of the measuring points with the distance from interface.

The present inventors have found that when the laser light was emitted in an oblique direction with respect to the inner surface of the crucible, the reflected light from the interface between the transparent layer and the bubble containing layer (light reflected by interface) was detected in addition to the reflected light from the inner surface of the crucible (light reflected by inner surface). Here, the interface between the transparent layer and the bubble containing layer is a plane where the bubble content rate changes dramatically, however, such interface is not as distinct as the interface between air and glass. Therefore, the finding that the light reflected from the interface between the transparent layer and the bubble containing layer can be detected was very surprising.

Then, the light reflected by inner surface and the light reflected by interface are detected by a different position of a detecting unit of the internal ranging section. This allows the measurement of the distance from inner surface, which is the distance between the internal ranging section and the inner surface, and the distance from interface, which is the distance between the internal ranging section and the interface, in accordance with the triangulation principle.

In addition, by carrying out the measurement at a plurality of measuring points along the inner surface of the crucible, the coordinates of the internal ranging section can be associated with the distance from inner surface and the distance from interface to obtain the coordinates of the inner surface of the crucible and the coordinates of the interface of the crucible that correspond to each of the measuring points.

Accordingly, by carrying out the measurement for each of the plurality of measuring points arranged as a mesh with 2 mm distance for example, coordinates of the inner surface and the coordinates of the interface can be obtained as a mesh. Thus, the three-dimensional shape of the inner surface and the interface of the crucible can be obtained. In addition, by calculating the distance between the inner surface and the interface, the thickness of the transparent layer can be calculated for arbitrary positions. Therefore, the three-dimensional distribution of the thickness of the transparent layer can be obtained.

<Determination of Three-Dimensional Distribution of Infrared Absorption Spectrum at the Inner Surface>

Preferably, The method further comprises the step of:

determining a three-dimensional distribution of an infrared absorption spectrum by measuring the infrared absorption spectrum at a plurality of measuring points on the three-dimensional shape of the inner surface.

One physical property which reflects the condition of the inner surface is the infrared absorption spectrum. This is since the infrared absorption spectrum at the inner surface of the crucible is affected by the condition of the glass (for example, density of OH group, crystallization state at the inner surface, and the like) at the inner surface.

Patent Documents 3 and 4 disclose measurement of the infrared absorption spectrum in the state of silica powder, however, the infrared adsorption spectrum is not measured for the crucible. Therefore, the evaluation of the condition of the inner surface using infrared absorption spectrum cannot be conducted with the methods disclosed in these documents.

The present invention has been made in view of these circumstances, and provides a method for determining precise three-dimensional distribution of the infrared absorption spectrum of the vitreous silica crucible.

The infrared absorption spectrum which reflects the condition of the inner surface of the crucible is a parameter for the monocrystalline silicon pulling step. However, in the conventional techniques, three-dimensional distribution of the infrared absorption spectrum has not been considered. In the present invention, determination of precise three-dimensional distribution of the infrared absorption spectrum has been enabled by the following method.

First, the three-dimensional shape of the inner surface of the crucible is obtained by the method described above. Then, when the three-dimensional shape of the inner surface of the crucible is obtained, the infrared absorption spectrum of the inner surface is measured for a plurality of measuring points on the three-dimensional shape. Accordingly, the three-dimensional distribution of the infrared absorption spectrum of the inner surface is determined. When the three-dimensional distribution of the infrared absorption spectrum is determined with such method, the three-dimensional distribution of the infrared absorption spectrum of the inner surface is determined precisely, since the three-dimensional shape of the inner surface was obtained precisely. The superior point of the method according to the present invention is that the three-dimensional distribution of the infrared absorption spectrum can be obtained for the actual product, since the three-dimensional distribution of the infrared absorption spectrum can be determined in a non-destructive manner.

When the three-dimensional distribution of the infrared absorption spectrum of the inner surface is determined, the quality inspection of the crucible can be conducted in accordance with this distribution. For example, the quality inspection can be carried out with the criteria of whether the infrared absorption spectrum is within a prescribed range, as well as the criteria of whether its distribution is within a prescribed range. When the infrared absorption spectrum or its distribution is not within the prescribed range, the inner surface may be subjected to fire polish or the like to adjust the infrared absorption spectrum to fall within the prescribed range.

Furthermore, the conditions for pulling the monocrystalline silicon may be set by taking into consideration the three-dimensional distribution of the infrared absorption spectrum of the inner surface. Accordingly, the pulling of the monocrystalline silicon can be conducted with high accuracy.

In addition, even when the pulling of the monocrystalline silicon fails by any possibility, the cause of such failure can be investigated if the three-dimensional distribution of the infrared absorption spectrum of the inner surface is determined before the usage of the crucible.

<Determination of Three-Dimensional Distribution of Raman Spectrum at the Inner Surface>

Preferably, the method further comprises the step of:

determining a three-dimensional distribution of a Raman spectrum by measuring the Raman spectrum at a plurality of measuring points on the three-dimensional shape of the inner surface.

One physical property which reflects the condition of the inner surface is the Raman spectrum. This is since the Raman spectrum at the inner surface of the crucible is affected by the condition of the glass (for example, density of OH group, crystallization state at the inner surface, and the like) at the inner surface.

Patent Document 3 discloses a measurement of the Raman spectrum in the state of silica powder, however, the Raman spectrum is not measured for the crucible. Therefore, the evaluation of the condition of the inner surface using Raman spectrum cannot be conducted with the method disclosed in the document.

The present invention has been made in view of these circumstances, and provides a method for determining precise three-dimensional distribution of the Raman spectrum of the vitreous silica crucible.

The Raman spectrum which reflects the condition of the inner surface of the crucible is a parameter for the monocrystalline silicon pulling step. However, in the conventional techniques, three-dimensional distribution of the Raman spectrum has not been considered. In the present invention, determination of precise three-dimensional distribution of the Raman spectrum has been enabled by the following method.

First, the three-dimensional shape of the inner surface of the crucible is obtained by the method described above. Then, when the three-dimensional shape of the inner surface of the crucible is obtained, the Raman spectrum of the inner surface is measured for a plurality of measuring points on the three-dimensional shape. Accordingly, the three-dimensional distribution of the Raman spectrum of the inner surface is determined. When the three-dimensional distribution of the Raman spectrum is determined with such method, the three-dimensional distribution of the Raman spectrum of the inner surface is determined precisely, since the three-dimensional shape of the inner surface was obtained precisely. The superior point of the method according to the present invention is that the three-dimensional distribution of the Raman spectrum can be obtained for the actual product, since the three-dimensional distribution of the Raman spectrum can be determined in a non-destructive manner.

When the three-dimensional distribution of the Raman spectrum of the inner surface is determined, the quality inspection of the crucible can be conducted in accordance with this distribution. For example, the quality inspection can be carried out with the criteria of whether the Raman spectrum is within a prescribed range, as well as the criteria of whether its distribution is within a prescribed range. When the Raman spectrum or its distribution is not within the prescribed range, the inner surface may be subjected to fire polish or the like to adjust the Raman spectrum to fall within the prescribed range.

Furthermore, the conditions for pulling the monocrystalline silicon may be set by taking into consideration the three-dimensional distribution of the Raman spectrum of the inner surface. Accordingly, the pulling of the monocrystalline silicon can be conducted with high accuracy.

In addition, even when the pulling of the monocrystalline silicon fails by any possibility, the cause of such failure can be investigated if the three-dimensional distribution of the Raman spectrum of the inner surface is determined before the usage of the crucible.

<Determination of Three-Dimensional Distribution of Bubble Distribution of Vitreous Silica Crucible>

Preferably, the method further comprises the step of:

determining a three-dimensional distribution of a bubble distribution by measuring the bubble distribution at a sidewall of the crucible corresponding to each of a plurality of measuring points, the plurality of measuring points being arranged on the three-dimensional shape of the inner surface of the crucible.

The inner surface of the crucible comes in contact with the silicon melt, and thus the bubbles existing near the inner surface of the crucible has a large effect on the monocrystal yield of the monocrystalline silicon. In addition, the bubble containing layer functions so as to transfer heat uniformly from the carbon heater placed around the crucible to the silicon melt. Therefore, it has a large effect on the thermal environment during the pulling of the monocrystalline silicon.

Patent Document 5 discloses that the manufacturing yield of the monocrystalline silicon can be improved by holding the distribution of the bubble diameter within a prescribed range. The document also discloses that the distribution of the bubble diameter should be set appropriately for the sidewall portion, corner portion, and the bottom portion.

However, the method of Patent Document only allows obtaining a rough view of the distribution of the bubble diameter. Therefore, the bubble distribution for a particular portion of the crucible cannot be understood. In addition, the method of Patent Document 5 can hardly determine the precise three-dimensional distribution of the bubble distribution of the crucible.

The present invention has been made in view of these circumstances, and provides a method for determining precise three-dimensional distribution of the bubble distribution of the vitreous silica crucible.

The distribution of the bubble distribution of the crucible has a large effect on the monocrystal yield of the monocrystalline silicone and on the thermal environment during the pulling of the monocrystalline silicon. In the present invention, determination of precise three-dimensional distribution of the bubble distribution of the crucible has been enabled by the following method.

First, the three-dimensional shape of the inner surface of the crucible is obtained by the method described above. Then, when the three-dimensional shape of the inner surface of the crucible is obtained, the bubble distribution is measured at a sidewall of the crucible corresponding to each of the plurality of measuring points. Accordingly, the three-dimensional distribution of the bubble distribution of the crucible is determined. The bubble distribution serves as a measure of how many bubbles having what size exist within a narrow measuring range, and as a measure of local bubble distribution. On the other hand, the three-dimensional distribution of the bubble distribution serves as a measure of how the bubble distribution changes within the entirety of the crucible. Therefore, the present invention can determine precise bubble distribution for a local portion of the crucible and precise bubble distribution for the entirety of the crucible.

The superior point of the method according to the present invention is that the three-dimensional distribution of the bubble distribution can be obtained for the actual product, since the three-dimensional distribution of the bubble distribution can be determined in a non-destructive manner. In the conventional method, the crucible was cut to prepare a sample, and the bubble distribution of this sample was measured. Accordingly, the conventional method was problematic in that the data cannot be obtained for the actual product, and the preparation of the sample required time and cost. Therefore, the present invention is advantageous since the bubble distribution of the actual product can be measured at low cost.

When the three-dimensional distribution of the bubble distribution is determined, the quality inspection of the crucible can be conducted in accordance with this distribution. For example, the quality inspection can be carried out with the criteria of whether the bubble distribution is within a prescribed range, as well as the criteria of whether its distribution is within a prescribed range. When the bubble distribution or its distribution is not within the prescribed range, shipment of such product may be prevented as a "NOT GOOD" product, and thus crucibles that are not within the prescribed range can be prevented from being shipped.

Furthermore, the conditions for pulling the monocrystalline silicon may be set by taking into consideration the three-dimensional distribution of the bubble distribution. Accordingly, the pulling of the monocrystalline silicon can be conducted with high accuracy.

In addition, even when the pulling of the monocrystalline silicon fails by any possibility, the cause of such failure can be investigated if the three-dimensional distribution of the bubble distribution is determined before the usage of the crucible.

<Determination of Three-Dimensional Distribution of Surface Roughness of Vitreous Silica Crucible>

Preferably, the method further comprises the step of:

determining a three-dimensional distribution of a surface roughness of the inner surface by measuring the surface roughness at a plurality of measuring points on the three-dimensional shape of the inner surface.

Patent Document 6 discloses that roughening of the inner surface of the crucible during the pulling of the monocrystalline silicon can be prevented by holding the surface roughness of the inner surface of the crucible within the prescribed range.

However, the variation in the surface roughness seen among the portions of the inner surface of the crucible is not taken into consideration in Patent Document 6 at all. Therefore, such variation may cause a problem during the pulling of the monocrystalline silicon, depending on the degree of such variation and the pulling conditions.

The present invention has been made in view of these circumstances, and provides a method for determining precise three-dimensional distribution of the surface roughness of the vitreous silica crucible.

As mentioned above, the surface roughness of the inner surface of the crucible is a parameter for the monocrystalline silicon pulling step. However, in the conventional techniques, three-dimensional distribution of the surface roughness has not been considered despite mentioning of the preference of holding the surface roughness within a particular range.

As mentioned above, the surface roughness of the inner surface of the crucible has a large effect on the strength of frictional force between the silicon melt and the inner surface of the crucible, the degree of the vibration at the surface of the silicon melt, and the degree of corrosion at the inner surface of the crucible. In the present invention, determination of precise three-dimensional distribution of the surface roughness has been enabled by the following method.

First, the three-dimensional shape of the inner surface of the crucible is obtained by the method described above. Then, when the three-dimensional shape of the inner surface of the crucible is obtained, the surface roughness of the inner surface is measured for a plurality of measuring points on the three-dimensional shape. Accordingly, the three-dimensional distribution of the surface roughness of the inner surface is determined. When the three-dimensional distribution of the surface roughness is determined with such method, the three-dimensional distribution of the surface roughness of the inner surface is determined precisely, since the three-dimensional shape of the inner surface was obtained precisely. The superior point of the method according to the present invention is that the three-dimensional distribution of the surface roughness can be obtained for the actual product, since the three-dimensional distribution of the surface roughness can be determined in a non-destructive manner. In the conventional method, the crucible was cut to prepare a sample, and the surface roughness of this sample was measured. Accordingly, the conventional method was problematic in that the data cannot be obtained for the actual product, and the preparation of the sample required time and cost. Therefore, the present invention is advantageous since the surface roughness of the actual product can be measured at low cost.

When the three-dimensional distribution of the surface roughness of the inner surface is determined, the quality inspection of the crucible can be conducted in accordance with this distribution. For example, the quality inspection can be carried out with the criteria of whether the surface roughness is within a prescribed range, as well as the criteria of whether its distribution is within a prescribed range. When the surface roughness or its distribution is not within the prescribed range, the inner surface may be subjected to fire polish or the like to adjust the surface roughness to fall within the prescribed range.

Furthermore, the conditions for pulling the monocrystalline silicon may be set by taking into consideration the three-dimensional distribution of the surface roughness of the inner surface. Accordingly, the pulling of the monocrystalline silicon can be conducted with high accuracy.

In addition, even when the pulling of the monocrystalline silicon fails by any possibility, the cause of such failure can be investigated if the three-dimensional distribution of the surface roughness of the inner surface is determined before the usage of the crucible.

<Determination of the Height of Liquid Surface for the Silicon Melt>

According to another aspect of the present invention, a method for manufacturing a monocrystalline silicon, comprising the steps of:

filling a vitreous silica crucible with a polycrystalline silicon;
melting the polycrystalline silicon to give a silicon melt;
allowing a seed crystal to come in contact with the silicon melt; and
pulling the seed crystal; wherein
a condition for pulling a monocrystalline silicon is determined in accordance with a result obtained from the aforedescribed method, is provided.

Preferably, a height of a liquid surface of the silicon melt before the seed crystal contacts the silicon melt is determined in accordance with a mass of the polycrystalline silicon and the three-dimensional shape of the vitreous silica crucible.

When the CZ method is carried out, it is important to detect the initial liquid surface. Conventionally, detection of the initial liquid surface was conducted by detecting the electrical continuity when the tip of the seed crystal comes in contact with the silicon melt. However, as disclosed in Patent Document 7 for example, precise detection of the liquid surface was difficult when a seed crystal having a pointed tip was used, since the tip of the seed crystal would melt as soon as it comes into contact with the silicon melt.

Patent Document 7 discloses a method in which an another crystal piece other than the seed crystal having a pointed tip is prepared, and the initial liquid surface is detected by the detection of the electrical continuity when the another crystal piece comes in contact with the silicon melt. However, this method requires complicated device configuration.

Furthermore, even when a seed crystal with round tip is used, the slight fusing of the tip is inevitable when the tip comes in contact with the silicon melt. Therefore, it is extremely difficult to detect the initial liquid surface precisely.

The present invention has been made in view of these circumstances, and provides a method for manufacturing the monocrystalline silicon which enables the precise pulling of the monocrystalline silicon, by precise detection of the initial liquid surface.

The pulling of the monocrystalline silicon starts from the point where the seed crystal is allowed to come in contact with the silicon melt. Therefore, the process to detect the initial liquid surface before the seed crystal comes in contact with the silicon melt is very important. However, as described above, it is difficult to precisely detect the initial liquid surface based on the electrical continuity of the seed crystal and the silicon melt.

Therefore, the present inventors have changed their thinking and achieved the invention to detect the initial liquid surface based on the mass of the polycrystalline silicon and the three-dimensional shape of the inner surface of the crucible.

When the mass of the polycrystalline silicon is obtained, the volume of the silicon melt can be obtained from its density. Then, when the three-dimensional shape of the inner surface of the crucible is determined, the volume for the inner capacity of the crucible up to an arbitrary height can be obtained. Accordingly, the height of the silicon melt (that is, the initial liquid surface) is determined.

One advantage of the present invention is that the initial liquid surface of the silicon melt can be determined before the polycrystalline silicon is melted. Therefore, the mass of the polycrystalline silicon can be adjusted to keep the initial liquid surface of the silicon melt at a particular position. Accordingly, variation in the position of the initial liquid surface of the silicon melt can be suppressed. In addition, there is also an advantage in that conditions for the pulling of the monocrystalline silicon (pulling speed and the like) can be determined in accordance with the three-dimensional shape of the inner surface.

Furthermore, the present invention is particularly advantageous with the huge sized crucibles having an outer diameter of 28 inches or more, and with the extra-huge sized crucibles having an outer diameter of 40 inches or more. This is due to the fact that importance of the optimum settings of the pulling conditions, including the initial liquid surface, is large since the loss caused by the failure of pulling is extremely large.

If the shape of the inner surface of the crucible is as the design drawing for all of the crucibles, the three-dimensional shape of the inner surface of the crucible can be determined merely by referring to the design drawing. However, in reality, the shape of the inner surface of the vitreous silica crucible varies among the crucibles. Therefore, it is essential to determine the three-dimensional shape of the inner surface of the crucible for each one of the crucibles. Therefore, in the present invention, the three-dimensional shape of the inner surface of the crucible is determined with high accuracy by the afore-described method.

<Determination of Descending Speed of the Liquid Surface of Silicon Melt>

Preferably, the vitreous silica crucible comprises a cylindrical sidewall portion, a curved bottom portion, and a corner portion connecting the sidewall portion and the bottom portion, the curvature of the corner portion being larger than that of the bottom portion; and the condition for pulling the monocrystalline silicon after the liquid surface of the silicon melt reaches the corner portion is determined in accordance with the three-dimensional shape of the inner surface of the vitreous silica crucible.

The crucible used for pulling the monocrystalline silicon comprises a cylindrical sidewall portion, a curved bottom portion, and a corner portion connecting the sidewall portion and the bottom portion, the curvature of the corner portion being larger than that of the bottom portion. When the pulling is conducted with such crucible, dislocation hardly occurs while the liquid surface of the silicon melt is positioned at the sidewall portion, since the descending speed of the liquid surface is slow and constant. However, when the liquid surface of the silicon melt reaches the boundary between the sidewall portion and the corner portion and descends further, the descending speed of the liquid surface becomes fast and its speed is at random. This is caused since the corner portion has a large curvature and thus the area of the liquid surface decreases rapidly as the liquid surface descends. Further, it is caused also since the corner portion is a portion where its shape varies comparatively, and thus the shape of the corner portion is different for each of the crucibles in strict sense.

Patent Document 8 discloses that the growth of the straight body portion of the monocrystalline silicon is terminated before the liquid surface of the silicon melt reaches the corner portion, in order to prevent the occurrence of dislocation at the corner portion of the crucible.

However, the method disclosed in Patent Document 8 is disadvantageous in that the length of the straight body portion of the monocrystalline silicon is sacrificed. Therefore, a technique which can prevent the dislocation without sacrificing the length of the straight body portion of the monocrystalline silicon has been desired.

The present invention has been made in view of these circumstances, and provides a method for manufacturing the monocrystalline silicon which enables to conduct appropriate pulling of the monocrystalline silicon, even at the corner portion of the vitreous silica crucible.

As described above, since the dislocation is prone to occur during the pulling conducted after the liquid surface of the silicon melt reaches the corner portion, the actual practice was as the conventional techniques of terminating the pulling before the liquid surface reaches the corner portion, or was to prevent the dislocation by adjusting the speed of the pulling based on the intuition of a skilled operator. In the former case, the silicon melt would be wasted and results in the rise in the manufacturing cost of the monocrystalline silicon. In the latter case, automation of the pulling step would be affected, resulting in the rise in the labor costs and eventually in the rise in the manufacturing cost.

Accordingly, the present inventors have changed their thinking and achieved the invention to prevent the dislocation and to enable automation of the pulling in the following way. That is, the three-dimensional shape of the inner surface of the crucible is measured beforehand, thereby predicting precise descending speed of the liquid surface at the corner portion, allowing to determine the pulling conditions such as the pulling speed of the monocrystalline silicon and the like based on such prediction.

BRIEF DESCRIPTION OF THE DRAWINGS

FIGS. 1(a) and 1(b) are each showing a state where the vitreous silica crucible is filled with polycrystalline silicon and a state where the polycrystalline silicon is melted, respectively.

FIGS. 2(a), 2(b), and 2(c) are each showing a step of pulling the monocrystalline silicon from the silicon melt retained in the vitreous silica crucible.

FIG. 3 is an explanatory drawing of a method for measuring the three-dimensional shape of the vitreous silica crucible.

FIG. 4 is an enlarged view of the vitreous silica crucible of FIG. 3, amplifying the internal ranging section and its vicinity.

FIG. 5 shows a result of the measurement carried out with the internal ranging section of FIG. 3.

FIG. 6 shows a result of the measurement carried out with the external ranging section of FIG. 3.

FIGS. 7(a) and 7(b) are each showing a shape of a crucible having minimum thickness and maximum thickness satisfying the dimension tolerance, respectively.

FIG. 8 shows an image of a bubble taken by using a confocal microscope.

FIG. 9 shows a three-dimensional image of the inner surface taken by using a confocal microscope.

FIG. 10 shows an example of an image with a foreign substance.

FIG. 11 shows an example of an optical system for taking an image of distortion.

FIGS. 12(a), 12(b) and 12(c) are explanatory drawings for a method to carry out the measurement while the crucible is held by the robot arm for conveyance.

DESCRIPTION OF THE PREFERRED EMBODIMENTS

Hereinafter, the embodiments of the present invention will be described with reference to figures.

<1. Vitreous Silica Crucible>

The vitreous silica crucible 11 used in the manufacturing method of a monocrystalline silicon according to an aspect of the present invention is, in one example, manufactured by a method comprising a silica powder layer forming step to form a silica powder layer by depositing the silica powder having an average particle diameter of approximately 300 μm onto the inner surface of a rotating mold; an arc fusing step to form a vitreous silica layer by arc fusing the silica powder layer while depressurizing the silica powder layer from the mold side (hereinafter referred to as a "rotating mold method").

During the early stage of the arc fusing step, the silica powder layer is strongly depressurized, thereby removing bubbles to form a transparent vitreous silica layer (hereinafter referred to as "transparent layer") 13. Then, the degree of depressurization is weakened to form a bubble containing vitreous silica layer (hereinafter referred to as "bubble containing layer") 15, with remaining bubbles. Accordingly, a vitreous silica crucible having a two-layer structure, with the transparent layer 13 at the inner surface side and the bubble containing layer 15 at the outer surface side can be formed.

As the silica powder used for the manufacture of the crucible, natural silica powder manufactured by pulverizing natural quartz, and synthetic silica powder manufactured by chemical synthesis can be mentioned. Here, physical property, shape, and size of natural silica powder tend to vary since the raw material of the natural silica powder is a natural product. When the physical property, shape, or size varies, the fused state of the silica powder varies, and thus the shape of the inner surface of the crucible being manufactured would vary among the crucibles, even when the arc fusing is conducted under the same conditions. Therefore, the shape of the inner surface need be measured for each one of the manufactured crucibles.

The vitreous silica crucible 11 comprises a corner portion 11b having a particularly large curvature, a cylindrical sidewall portion having a rim portion opening towards the upper side, and a mortar-shaped bottom portion 11c having a particularly small curvature. In the present invention, the corner portion is a portion where the sidewall portion 11a and the bottom portion 11c are linked, and starts from the point where the tangential line of the curve of the corner portion falls on the sidewall portion 11a of the vitreous silica crucible, to the point where the tangential line of the corner portion and the tangential line of the bottom portion 11c becomes the common tangent. In other words, the point where the sidewall portion 11a of the vitreous silica crucible 11 starts to bend is the boundary between the sidewall portion 11a and the corner portion 11b. Further, the portion of the bottom of the crucible where the curvature is constant is the bottom portion 11c, and the point where the curvature starts to change as the distance from the center of the bottom of the crucible increases is the boundary between the bottom portion 11c and the corner portion 11b.

<2. Filling and Melting of the Polycrystalline Silicon>

When the monocrystalline silicon is pulled, the crucible 11 is filled with polycrystalline silicon 21 as shown in FIG. 1(a), and then the polycrystalline silicon is heated and melted using a carbon heater placed around the crucible 11 to give a silicon melt 23 as shown in FIG. 1(b).

The volume of the silicon melt 23 can be obtained from the mass of the polycrystalline silicon 21, and thus the height H0 of the liquid surface 23a of the silicon melt can be obtained from the mass of the polycrystalline silicon 21 and the three-dimensional shape of the inner surface of the crucible 11. According to the present invention, the three-dimensional shape of the inner surface of the crucible 11 can be obtained by the method described hereinafter, and the volume up to an arbitrary height of the crucible 11 can be obtained. Accordingly, the initial height H0 of the liquid surface 23a of the silicon melt 23 can be determined.

After the initial height H0 of the liquid surface 23a of the silicon melt 23 is determined, as shown in FIG. 2(a), the tip of the seed crystal 24 is lowered so as to come in contact with the silicon melt 23, and then the seed crystal is pulled slowly to conduct the pulling of the monocrystalline silicon 25.

As shown in FIG. 2(b), in a case where the liquid surface 23a is positioned at the sidewall portion 11a of the crucible 11 when the pulling of the straight body portion (portion having a constant diameter) of the monocrystalline silicon 25 is conducted, the controlling of the pulling is easy since the descending speed V of the liquid surface 23a is constant if the pulling is conducted at a constant speed.

However, a shown in FIG. 2(c), when the liquid surface 23a reaches the corner portion 11b of the crucible 11, the area of the liquid surface 23a decreases sharply as the descending of the liquid surface 23a, and thus the descending speed V of the liquid surface 23a increases sharply. The descending speed V depends on the shape of the inner surface at the corner portion 11b. Here, however, this shape of the inner surface at the corner portion 11b varies a little among the crucibles. Therefore, it is difficult to understand how the descending speed V would change beforehand, and thus automation of the pulling was affected.

In the present embodiment, the three-dimensional shape of the inner surface of the crucible can be obtained by the method described hereinafter, and the shape of the inner surface at the corner portion 11b can be understood beforehand. Therefore, it becomes possible to precisely predict how the descending speed V would change. Based on such prediction, the pulling conditions such as the pulling speed of the monocrystalline silicon 25 can be determined. Accordingly, the dislocation can be prevented at the corner portion 11b, and automation of the pulling can be realized.

<3. Method for Measuring Precise Three-Dimensional Shape>

Hereinafter, the method for measuring the three-dimensional shape of the inner surface of the crucible will be explained with reference to FIGS. 3 to 7. In the present embodiment, the internal ranging section 17 comprising a laser displacement gauge and the like is contactlessly moved along the inner surface of the crucible. For each of the plurality of measuring points along the moving course, the inner surface of the crucible is irradiated with a laser light, the laser light being emitted in an oblique direction with respect to the inner surface. Then, the reflected light is detected to measure the three-dimensional shape of the inner surface of the crucible. Hereinafter, the method will be described in detail. Here, when the shape of the inner surface is being measured, the three-dimensional shape of the interface between the transparent layer 13 and the bubble containing layer 15 can be measured simultaneously. In addition, the three-dimensional shape of the outer surface of the crucible can be measured by using the external ranging section 19. These aspects will be also explained.

<3-1. Arrangement of Vitreous Silica Crucible, Internal Robot Arm, Internal Ranging Section>

The vitreous silica crucible 11 as a measuring object is mounted on the rotatable rotating table 9 with its opening portion facing downwards. The internal robot arm 5 is arranged on the base 1, the base 1 being arranged at a position covered with the crucible 11. The internal robot arm 5 is preferably a six-axis articulated robot, comprising a plurality of arms 5a, a plurality of joints 5b rotatably supporting the arm 5a, and a main body section 5c. An external terminal (not shown) is provided to the main body section 5c, to enable the main body section 5c to exchange data with an external device. The tip of the internal robot arm 5 is provided with a internal ranging section 17 to measure the shape of the inner surface of the crucible 11. The inner surface of the crucible 11 is irradiated with a laser light from the internal ranging section 17, and the reflected light from the inner surface is detected to measure the distance between the internal ranging section 17 and the inner surface of the crucible 11. A controlling section to control the joints 5b and the internal ranging section 17 is provided inside the main body section 5c. The controlling section moves the arm 5a by rotating the joints 5b in accordance with a program installed in the main body section 5c or with an external input signal, thereby moving the internal ranging section to an arbitrary three-dimensional position. Specifically, the internal ranging section 17 is contactlessly moved along the inner surface of the crucible. Here, the controlling section is provided with data for the rough shape of the inner surface of the crucible, and the position of the internal ranging section 17 is moved in accordance with the data.

More specifically, for example, the measurement is started from a position near the opening portion of the crucible 11, as shown in FIG. 3(a). Then the internal ranging section 17 is moved towards the bottom portion 11c of the crucible 11, to carry out the measurement for a plurality of measuring points along the moving course, as shown in FIG. 3(b). The interval of the measurement is 1-5 mm for example, and 2 mm for example. The measurement is conducted with the timing pre-stored in the internal ranging section 17, or in accordance with an external trigger. The results of the measurement are stored in the memory section of the internal ranging section 17, and are sent all together to the main body section 5c after the measurement is completed, or are sent to the main body section 5c each time after each of the measurement is conducted. The internal ranging section 17 may be structured so as to be controlled by a controlling section provided individually from the main body section 5c.

When the measurement from the opening portion to the bottom portion 11c of the crucible is finished, the rotating table 9 is rotated with a small angle, and a similar measurement is conducted. This measurement may be conducted from the bottom portion 11c towards the opening portion. The rotating angle of the rotating table 9 is determined by taking the accuracy and the measuring time into consideration and is 2-10 degrees (preferably 6.3 degrees or less). When the rotating angle is too large, the accuracy of measurement is insufficient, and when the rotating angle is too small, the measuring time becomes too long. The rotation of the rotating table 9 is controlled in accordance with a stored program or with an external input signal. The rotating angle of the rotating table 9 can be detected with a rotary encoder and the like. The rotation of the rotating table 9 is preferably linked with the movement of the internal ranging section 17 and the external ranging section 19 described later. By such, the calculation of the three-dimensional coordinates of the internal ranging section 17 and the external ranging section 19 becomes easy.

As described later, the internal ranging section 17 can measure both of the distance from the internal ranging section 17 to the inner surface (distance from inner surface), and the distance from the internal ranging section 17 to the interface between the transparent layer and the bubble containing layer 15 (distance from interface). Since the angle of the joint 5b is known from the rotary encoder and the like provided to the joint 5b, the three-dimensional coordinates and the direction of the internal ranging section 17 at each of the measuring points are also known. Accordingly, if the distance from inner surface and the distance from interface can be obtained, the three-dimensional coordinates at the inner surface and the three-dimensional coordinates at the interface are known. Then, since the measurement from the opening portion to the bottom portion 11c of the crucible 11 is conducted for the entire circumference of the crucible 11, the three-dimensional shape of the inner surface and the three-dimensional shape of the interface of the crucible 11 are known. In addition, since the distance between the inner surface and the interface is known, the thickness of the transparent layer 13 is known, and thus the three-dimensional distribution of the thickness of the transparent layer can be obtained.

<3-2. External Robot Arm, External Ranging Section>

On the base 3 provided outside the crucible 11, the external robot arm 7 is arranged. The external robot arm 7 is preferably a six-axis articulated robot, comprising a plurality of arms 7a, a plurality of joints 7b rotatably supporting the arm 7a, and a main body section 7c. An external terminal (not shown) is provided to the main body section 7c, to enable the main body section 7c to exchange data with an external device. The tip of the external robot arm 7 is provided with an external ranging section 19 to measure the shape of the outer surface of the crucible 11. The outer surface of the crucible 11 is irradiated with a laser light from the external ranging section 19, and the reflected light from the outer surface is detected to measure the distance between the external ranging section 19 and the outer surface of the crucible 11. A controlling section to control the joints 7b and the external ranging section 19 is provided inside the main body section 7c. The controlling section moves the arm 7a by rotating the joints 7b in accordance with a program installed in the main body section 7c or with an external input signal, thereby moving the external ranging section to an arbitrary three-dimensional position. Specifically, the external ranging section 19 is contactlessly moved along the outer surface of the crucible. Here, the controlling section is provided with data for the rough shape of the outer surface of the crucible, and the position of the external ranging section 19 is moved in accordance with the data. More specifically, for example, the measurement is started from a position near the opening portion of the crucible 11, as shown in FIG. 3(a). Then the external ranging section 19 is moved towards the bottom portion 11c of the crucible 11, to conduct the measurement for a plurality of measuring points along the moving course, as shown in FIG. 3(b). The interval of the measurement is 1-5 mm for example, and 2 mm for example. The measurement is conducted with the timing pre-stored in the external ranging section 19, or in accordance with an external trigger. The results of the measurement are stored in the memory section of the external ranging section 19, and are sent all together to the main body section 7c after the measurement is completed, or are sent to the main body section 7c each time after each of the measurement is conducted. The external ranging section 19 may be structured so as to be controlled by a controlling section provided individually from the main body section 7c.

The movement of the internal ranging section 17 and the external ranging section 19 may be synchronized. However, since the measurement of the shape of the inner surface and the shape of the outer surface are conducted independently, it is not necessary to synchronize their movement.

The external ranging section 19 can measure the distance from the external ranging section 19 to the outer surface (distance from outer surface). Since the angle of the joint 7b is known from the rotary encoder and the like provided to the joint 7b, the three-dimensional coordinates and the direction of the external ranging section 19 are also known. Accordingly, if the distance from outer surface can be obtained, the three-dimensional coordinates at the outer surface are known. Then, since the measurement from the opening portion to the bottom portion 11c of the crucible 11 is conducted for the entire circumference of the crucible 11, the three-dimensional shape of the outer surface of the crucible 11 is known.

Accordingly, since the three-dimensional shape of the inner surface and the outer surface of the crucible are known, the three-dimensional distribution of the wall thickness can be obtained for the crucible.

<3-3. Details of Measurement of Distance>

Here, the measurement of the distance by the internal ranging section 17 and the external ranging section 19 will be described in detail with reference to FIG. 4.

As shown in FIG. 4, the internal ranging section 17 is arranged at the inner surface side of the crucible 11 (at the transparent layer 13 side), and the external ranging section 19 is arranged at the outer surface side of the crucible 11 (at the bubble containing layer 15 side). The internal ranging section 17 comprises an emitting section 17a and a detecting section 17b. The external ranging section 19 comprises an emitting section 19a and a detecting section 19b. In addition, the internal ranging section 17 and the external ranging section 19 are each provided with a controlling section and an external terminal not shown. The emitting sections 17a and 19a are ones which emit a laser light, and are provided with a semiconductor laser source for example. The wavelength of the laser light being emitted is not particularly limited, however, it may be a red laser light having a wavelength of 600-700 nm. The detecting sections 17b and 19b are structured with CCD for example, and thus the distance to the target is determined based on the principle of triangulation, from the position where the light falls on.

The laser light emitted from the emitting sections 17a of the internal ranging section 17 is partially reflected at the inner surface (surface of the transparent layer 13), and is partially reflected at the interface between the transparent layer 13 and the bubble containing layer 15. These reflected lights (light reflected by inner surface and the light reflected by interface) strike the detecting section 17b, and are thus detected. As obvious from FIG. 4, the light reflected by inner surface and the light reflected by interface strike different positions of the detecting section 17b. From this difference in the position, the distance from the internal ranging section 17 to the inner surface (distance from inner surface) and the distance from the internal ranging section 17 to the interface (distance from interface) are determined respectively. Preferable angle of incidence θ may differ in accordance with the condition of the inner surface, thickness of the transparent layer 13, condition of the bubble containing layer 15 and the like. For example, it is 30-60 degrees.

FIG. 5 shows an actual result of the measurement conducted with a commercially available laser displacement gauge. As shown in FIG. 5, two peaks are observed, wherein the peak at the inner surface side corresponds to the peak of the light reflected by inner surface, and the peak at the outer surface corresponds to the peak of the light reflected by interface. As seen in FIG. 5, the peak due to the reflected light from the interface between the transparent layer 13 and the bubble containing layer 15 is also detected clearly. Conventionally, interface had not been confirmed by such method, and thus this result is remarkably novel.

When the distance from the internal ranging section 17 to the inner surface is too large, or when the inner surface or the interface is locally oblique, there are cases where not both of the peaks are observed. In such case, it is preferable that the internal ranging section 17 is moved closer to the inner surface, or the internal ranging section 17 is tilted to alter the outgoing direction of the laser light, so as to search a position and an angle which allows the observation of two peaks. In addition, even when both of the peaks are not observed at the same time, the light reflected by inner surface may be observed at a certain position and an angle, and then the light reflected by interface may be observed at a different position and an angle. In addition, in order to prevent the internal ranging section 17 from coming into contact with the inner surface, it is preferable that the maximum proximity position is set, thereby preventing the internal ranging section 17 from coming close to the inner surface from such position even when the peak is not observed.

Further, when there is an isolated bubble in the transparent layer 13, the internal ranging section 17 detects the reflected light from this bubble, and thus there are cases where the interface between the transparent layer 13 and the bubble containing layer 15 cannot be detected appropriately. Therefore, in a case where the position of the interface measured at a particular measuring point A shifts largely (exceeding a predetermined standard value) from the position of the interface measured at the measuring points before and after the measuring point A, the data obtained for the measuring point A may be eliminated. In such cases, the measurement may be conducted again at a position slightly shifted from the measuring point A, and the data obtained as such may be used.

In addition, the laser light emitted from the emitting section 19a of the external ranging section 19 is reflected at the surface of the outer surface (bubble containing layer 15), the reflected light (light reflected by outer surface) strikes the detecting section 19b, and thus the reflected light is detected. The distance between the external ranging section 19 and the outer surface is determined in accordance with the position of detection at the detecting section 19b. FIG. 6 shows the actual result of the measurement conducted with a commercially available laser displacement gauge. As shown in FIG. 6, only one peak is observed. In a case where the peak is not observed, it is preferable that the external ranging section 19 is moved closer to the inner surface, or the external ranging section 19 is tilted to alter the outgoing direction of the laser light, so as to search a position and an angle which allows the observation of the peak.

<3-4. Evaluation of the Crucible Shape Taking Dimension Tolerance into Consideration>

FIGS. 7(a) and 7(b) each show a shape of a crucible having minimum thickness and a shape of a crucible having a maximum thickness that satisfy the dimension tolerance for the original design, respectively. Since the dimension tolerance for the sidewall portion 11a, the corner portion 11b, and the bottom portion 11c are different from each other, their boundary is discontinuous. When the shape of the crucible 11 determined from the three-dimensional shape of the inner surface of the crucible 11 and the three-dimensional shape of the outer surface determined from the above-described method are within the shape of the crucible having minimum thickness satisfying the dimension tolerance shown in FIG. 7(a) and the shape of the crucible having maximum thickness satisfying the dimension tolerance shown in FIG. 7(b), the shape of the crucible 11 satisfies the dimension tolerance. In such case, the shape inspection test is passed. On the other hand, when at least a part of the shape of the crucible 11 determined is not within the shape of FIG. 7(a) or FIG. 7(b), the shape inspection test is not passed. By this method, crucibles having shapes that are out of the tolerance zone can be prevented from being shipped.

<4. Three-Dimensional Distribution of Various Physical Properties>

The internal robot arm 5 and the external robot arm 7 can be equipped with a probe for measuring various physical properties. By moving the probe along the three-dimensional shape of the inner surface or the three-dimensional shape of the outer surface of the crucible 11, three-dimensional distribution of various physical properties can be determined. The internal robot arm 5 and the external robot arm 7 may be equipped with a plurality of kinds of probes to measure a plurality of physical properties simultaneously, or the probe may be appropriately changed to measure the plurality of physical properties. In addition, the probes may be changed manually or may be changed automatically using an auto-changer.

Further, the afore-mentioned internal ranging section 17, the external ranging section 19, and the various probes described later are connected with an external processor having a database function, and can be structured so that the measurement data is taken into the database immediately after the measurement. Here, at the external processor, judgment on PASSED/NOT PASSED can be made for the various shapes and the physical properties, and thus quality inspection of the crucible can be conducted easily.

<4-1. Three-Dimensional Distribution of Infrared Absorption Spectrum of the Inner Surface of the Crucible>

The infrared absorption spectrum of the inner surface can be measured at a plurality of measuring points on the three-dimensional shape of the inner surface of the crucible, thereby enabling the determination of the three-dimensional distribution of infrared absorption spectrum.

There is no particular limitation with respect to the method for measuring the infrared absorption spectrum at each of the measuring points, so long as it is in a contactless manner. Measurement is conducted by irradiating the inner surface with infrared light, followed by detection of the reflected light, and thus the infrared absorption spectrum is obtained as the difference of the spectrum of the irradiated light and the spectrum of the reflected light.

The arrangement of the measuring points is not particularly limited. For example, the measuring points are arranged with 5-20 mm interval in the direction from the opening portion to the bottom portion of the crucible, and with 10-60 degrees interval in the circumferential direction.

The actual measurement is carried out by, for example, fixing a probe for measuring infrared absorption spectrum to the tip of the internal robot arm 5, and then moving the probe along the inner surface in a similar manner as the internal ranging section 17 in a contactless manner. When the internal ranging section 17 was moved, the three-dimensional shape of the inner surface was understood only roughly, and the precise three-dimensional shape of the inner surface was unknown. Therefore, the internal ranging section 17 was moved in accordance with the roughly understood three-dimensional shape. Here, when the infrared absorption spectrum is being measured, the precise three-dimensional shape of the inner surface is understood. Therefore, the distance between the inner surface and the probe can be controlled with high accuracy when moving the probe for measuring infrared absorption spectrum.

The probe for measuring infrared absorption spectrum is moved from the opening portion to the bottom portion of the crucible, and the infrared absorption spectrum is measured at the plurality of measuring points along its migration pathway. Then, the rotating table 9 is rotated, and the measurement of the infrared absorption spectrum for the different portion of the crucible 11 is conducted.

The infrared absorption spectrum for the entire inner surface can be conducted in this way, and the results obtained can be used for determining the three-dimensional distribution of the infrared absorption spectrum of the inner surface of the crucible.

<4-2. Three-Dimensional Distribution of Raman Spectrum of the Inner Surface of the Crucible>

The Raman spectrum of the inner surface can be measured at a plurality of measuring points on the three-dimensional shape of the inner surface of the crucible, thereby enabling the determination of the three-dimensional distribution of Raman spectrum.

There is no particular limitation with respect to the method for measuring the Raman spectrum at each of the measuring points, so long as it is in a contactless manner. Measurement is conducted by irradiating the inner surface with laser light, followed by detection of the Raman scattering.

The arrangement of the measuring points is not particularly limited. For example, the measuring points are arranged with 5-20 mm interval in the direction from the opening portion to the bottom portion of the crucible, and with 10-60 degrees interval in the circumferential direction.

The actual measurement is carried out by, for example, fixing a probe for measuring Raman spectrum to the tip of the internal robot arm 5, and then moving the probe along the inner surface in a similar manner as the internal ranging section 17 in a contactless manner. When the internal ranging section 17 was moved, the three-dimensional shape of the inner surface was understood only roughly, and the precise three-dimensional shape of the inner surface was unknown. Therefore, the internal ranging section 17 was moved in accordance with the roughly understood three-dimensional shape. Here, when the Raman spectrum is being measured, the precise three-dimensional shape of the inner surface is understood. Therefore, the distance between the inner surface and the probe can be controlled with high accuracy when moving the probe for measuring Raman spectrum.

The probe for measuring Raman spectrum is moved from the opening portion to the bottom portion of the crucible, and the Raman spectrum is measured at the plurality of measuring points along its migration pathway. Then, the rotating table 9 is rotated, and the measurement of the Raman spectrum for the different portion of the crucible 11 is conducted.

The Raman spectrum for the entire inner surface can be conducted in this way, and the results obtained can be used for determining the three-dimensional distribution of the Raman spectrum of the inner surface of the crucible.

<4-3. Three-Dimensional Distribution of Bubble Distribution of the Crucible>

The bubble distribution at the sidewall of the crucible corresponding to each of the plurality of measuring points, the plurality of measuring points being arranged on the three-dimensional shape of the inner surface of the crucible, is measured. Accordingly, the three-dimensional distribution of the bubble distribution can be determined.

There is no particular limitation with respect to the method for measuring the bubble distribution at the sidewall of the crucible corresponding to each of the plurality of measuring points, so long as it is in a contactless manner. When the measurement is conducted by using a confocal microscope, a clear image enabling to clearly understand the position of the bubble as shown in FIG. 8 can be obtained, and thus measurement with high accuracy can be conducted. In addition, the three-dimensional position and the size of the bubbles can be understood by shifting the focal point and obtaining the image as FIG. 8 for each of the focal points, and then compositing the images. Accordingly, the bubble distribution can be obtained. As the method for shifting the focal point, (1) moving the crucible, (2) moving the probe, (3) moving the objective lens on the probe, and the like can be mentioned.

The arrangement of the measuring points is not particularly limited. For example, the measuring points are arranged with 5-20 mm interval in the direction from the opening portion to the bottom portion of the crucible, and with 10-60 degrees interval in the circumferential direction.

The actual measurement is carried out by, for example, fixing a probe for confocal microscope to the tip of the internal robot arm 5, and then moving the probe along the inner surface in a similar manner as the internal ranging section 17 in a contactless manner. When the internal ranging section 17 was moved, the three-dimensional shape of the inner surface was understood only roughly, and the precise three-dimensional shape of the inner surface was unknown. Therefore, the internal ranging section 17 was moved in accordance with the roughly understood three-dimensional shape. Here, when the bubble distribution is being measured, the precise three-dimensional shape of the inner surface is understood. Therefore, the distance between the inner surface and the probe can be controlled with high accuracy when moving the probe for confocal microscope.

The probe for confocal microscope is moved from the opening portion to the bottom portion of the crucible, and the bubble distribution is measured at the plurality of measuring points along its migration pathway. Then, the rotating table 9 is rotated, and the measurement of the bubble distribution for the different portion of the crucible 11 is conducted.

The bubble distribution for the entire inner surface can be conducted in this way, and the results obtained can be used for determining the three-dimensional distribution of the bubble distribution of the crucible.

<4-2. Three-Dimensional Distribution of Surface Roughness of the Inner Surface of the Crucible>

The surface roughness of the inner surface can be measured at a plurality of measuring points on the three-dimensional shape of the inner surface of the crucible, thereby enabling the determination of the three-dimensional distribution of surface roughness.

There is no particular limitation with respect to the method for measuring the surface roughness at each of the measuring points, so long as it is in a contactless manner. Measurement can be conducted with high accuracy if the confocal microscope, which can obtain information from the focused plane selectively, is used. In addition, when the confocal microscope is used, information on precise three-dimensional structure of the surface, as shown in FIG. 9, can be obtained. Accordingly, surface roughness can be determined from such information. Surface roughness can be any one of arithmetical mean deviation of profile (Ra), maximum height (Rmax), ten-point mean height (Rz). Other parameters reflecting the surface roughness may be adopted.

The arrangement of the measuring points is not particularly limited. For example, the measuring points are arranged with 5-20 mm interval in the direction from the opening portion to the bottom portion of the crucible, and with 10-60 degrees interval in the circumferential direction.

The actual measurement is carried out by, for example, fixing a probe for confocal microscope to the tip of the internal robot arm 5, and then moving the probe along the inner surface in a similar manner as the internal ranging section 17 in a contactless manner. When the internal ranging section 17 was moved, the three-dimensional shape of the inner surface was understood only roughly, and the precise three-dimensional shape of the inner surface was unknown. Therefore, the internal ranging section 17 was moved in accordance with the roughly understood three-dimensional shape. Here, when the surface roughness is being measured, the precise three-dimensional shape of the inner surface is understood. Therefore, the distance between the inner surface and the probe can be controlled with high accuracy when moving the probe for confocal microscope.

The probe for confocal microscope is moved from the opening portion to the bottom portion of the crucible, and the surface roughness is measured at the plurality of measuring points along its migration pathway. Then, the rotating table 9 is rotated, and the measurement of the surface roughness for the different portion of the crucible 11 is conducted.

The surface roughness for the entire inner surface can be conducted in this way, and the results obtained can be used for determining the three-dimensional distribution of the surface roughness of the inner surface of the crucible.

In addition, surface roughness of the outer surface can be measured at a plurality of measuring points on the three-dimensional shape of the outer surface of the crucible in a similar manner as the inner surface, thereby enabling the determination of the three-dimensional distribution of the surface roughness of the outer surface.

<4-5. Three-Dimensional Position of Foreign Substance in the Crucible>

An image of the inner surface can be taken at a plurality of measuring points on the three-dimensional shape of the inner surface of the crucible, thereby enabling the determination of the three-dimensional position of the foreign substance.

When the images acquired from each of the measuring points are analyzed, images for the measuring points with no foreign substance would show nothing. When there is a colored foreign substance on the surface of or inside the crucible 11, a blackish shadow appears in the image as shown in FIG. 10. Accordingly, a foreign substance can be detected by detecting such shadow. Since the coordinates of the positions where the images were taken are known, the position where the image showing the foreign substance had been taken can be understood, the position being known as the possession within the three-dimensional shape of the inner surface of the crucible 11.

From the image as shown in FIG. 10, it is difficult to understand whether the foreign substance exists on the inner surface or in depth with respect to the direction of the thickness of the crucible. Therefore, a confocal microscope is used to take an image of the foreign substance by shifting the focal point in the direction of the thickness of the crucible 11 at the position where the foreign substance had been detected. By taking the image in such manner, the depth of the foreign substance can be identified.

<4-6. Three-Dimensional Distribution of Distortion of the Crucible>

An image of the distortion of the inner surface can be taken at a plurality of measuring points on the three-dimensional shape of the inner surface of the crucible, thereby enabling the determination of the three-dimensional distribution of distortion.

The optical system for taking the image of distortion comprises, in one example as shown in FIG. 11, a light emitting section 32 and a receiving section 36. The light emitting section 32 further comprises a light source 31 for irradiating the crucible 11 with light and a polarizer 33 for polarizing the light from the light source 31. The receiving section 36 further comprises an analyzer 35 of which direction of the transmission axis being arranged so as to be substantially orthogonal with the polarizer 31, a lens 37 for condensing light that passed through the analyzer 35, and an optical receiver 39 for detecting the light condensed by the lens 37 (for example, a CCD camera). The vitreous silica which structures the crucible 11 has no birefringence when there is no distortion, and thus the direction of polarization does not change after passing the crucible. Accordingly, the component of the light which passes through the analyzer is substantially 0. On the other hand, when the vitreous silica has distortion (residual stress), it has birefringence. Therefore, when the light which passed the polarizer 33 further passes the crucible 11, the direction of polarization changes, and thus the there would be a component of light which passes through the analyzer 35. Accordingly, by detecting the component of light which passes through the analyzer 35 with the optical receiver 39 via the lens 37, an image of distortion can be taken. The lens 37 may be omitted.

In FIG. 11, the light emitting section 32 is placed at the outer side of the crucible 11, and the receiving section 36 is placed at the inner side of the crucible 11, however, the light emitting section 32 may be placed at the inner side of the crucible and the receiving section 36 may be placed at the outer side of the crucible. In FIG. 11, a robot arm is not shown, however, among the light emitting section 32 and the receiving section 36, the one which is to be placed at the outer side of the crucible may be fixed to the external robot arm 7, and the one which is to be placed at the inner side of the crucible may be fixed to the internal robot arm 5. Then, the external robot arm 7 and the internal robot arm 5 may be synchronized to move along the three-dimensional shape of the outer surface and the inner surface of the crucible, as shown by the arrow Z in FIG. 11. Image can be taken at a plurality of points along the way, and thus the three-dimensional distribution of the distortion of the crucible can be determined.

<5. Measurement Conducted while Holding with Robot Arm>

In the afore-mentioned embodiments explained with reference to FIGS. 3(a) and 3(b), measurement was conducted by mounting the crucible 11 on the rotating table 9. Here, in another embodiment, as shown in FIGS. 12(a)-8(c), measurement may be conducted while the crucible 11 is hold by a robot arm for conveyance 6. Detailed description will be given hereinafter.

As shown in FIG. 12(a), the crucible as a measuring object is mounted on a mounting table 43 with its opening portion facing downwards. Near the mounting table 43, a robot arm for conveyance 6 is placed on a setting table 41. The robot arm for conveyance 6 is preferably a six-axis articulated robot, comprising a plurality of arms 6a, a plurality of joints 6b rotatably supporting the arm 6a, and a main body section 6c. An external terminal (not shown) is provided to the main body section 6c, to enable the main body section 6c to exchange data with an external device.

The tip of the robot arm for conveyance 6 is provided with a holding section 49 to hold the crucible 11. The holding section 49 comprises a base 45 and at least four arms 47 extending from the base 45. In FIG. 12(a), the four arms are arranged with an interval of 90 degrees in the circumferential direction. The arms 47 can be moved toward the center in the direction of the radius of the crucible 11, that is, in the direction shown with the arrow X in FIG. 12(a). The arms 47 are pressed against the sides of the crucible 11 with the holding section 49 in a state where the crucible 11 is positioned within the four arms 47. The outer side of the crucible 11 is the bubble containing layer 15, and its surface is rough. An elastic member 48 such as urethane rubber is provided on the surface of the arms 47 at the side of the crucible 11. Accordingly, the holding section 49 holds the crucible 11 steadily by the friction between the elastic member 48 and the side surface of the crucible 11. Here, in order not to destroy the crucible by applying too large pressure to the crucible 11 with the arm 47, the pressure being applied to the crucible from the arms 47 is controlled within an appropriate value by using a pressure sensor and the like.

FIG. 12(b) shows a state in which the holding section 49 is holding the crucible 11. From this state, the robot arm for conveyance 6 picks up the crucible 11, and then conveys the crucible 11 to the measuring area placed with the internal robot arm 5. Here, although not shown, the external robot arm 7 may be placed in the measuring area.

Then, as shown in FIG. 12(c), the robot arm for conveyance 6 holds the crucible within the measuring area, and, in such state, the internal robot arm 5 moves the internal ranging section 17 and the various probes along the inner surface of the crucible 11 to carry out the measurement.

Measurement for a particular position of the crucible with respect to the circumferential direction of the crucible 11 is carried out by moving the internal ranging section 17 between the bottom portion 11c and the opening portion of the crucible 11. Subsequently, the robot arm for conveyance 6 rotates the crucible 11 in the circumferential direction (the direction of the arrow Y shown in FIG. 12(c)). Then, the measurement is carried out again by moving the internal ranging section 17 between the bottom portion 11c and the opening portion of the crucible 11. Accordingly, the measurement can be carried out for the entire inner circumference surface by repeating the rotation of the crucible 11 and the measurement.

The rotation angle of the rotation after each of the measurement is, 2-10 degrees for example, preferably 6.3 degrees or less. When the rotation angle is 6.3 degrees or less, the difference in the sum length of the sides of the polygonal structured by connecting each of the measuring points in the circumferential direction with respect to the circumferential length of the perfect circle is 1% or less, and thus sufficient precision can be achieved.

The invention claimed is:

1. A method for evaluating a vitreous silica crucible having a cylindrical sidewall portion having an opening with a rim portion, a mortar-shaped bottom portion, and a corner portion connecting the sidewall portion and the bottom portion, said corner portion having a curvature larger than a curvature of the bottom portion, wherein the crucible comprises a transparent vitreous silica layer at an inner surface side, and a bubble containing layer at an outer surface side, said method comprising the steps of:

moving an internal ranging section along an inner surface of all portions of the vitreous silica crucible constituted by the sidewall portion, the corner portion, and the mortar-shaped bottom portion, in a contactless manner;

measuring a distance between the internal ranging section and the inner surface of the transparent vitreous silica layer as a distance from the inner surface, by subjecting the inner surface of the crucible to irradiation with single laser light and then detecting a reflected light from the inner surface, the laser light being emitted from the internal ranging section in an oblique direction with respect to the inner surface, and the measurement being conducted at a plurality of measuring points along a course of a movement of the internal ranging section, wherein the plurality of measuring points include points at the sidewall portion, the corner portion, and the bottom portion;

obtaining a three-dimensional shape of the inner surface of the crucible, by associating three-dimensional coordinates of each of the measuring points with the distance from the inner surface;

measuring a distance between the internal ranging section and an interface between the transparent vitreous silica layer and the bubble containing layer, as a distance from the interface by using the single laser light and detecting light reflected by the interface with the internal ranging section;

obtaining a three-dimensional shape of the interface by associating three-dimensional coordinates of each of the measuring points with the distance from the interface;

wherein the single laser light emitted from the internal ranging section is partially reflected at the inner surface of the transparent vitreous silica layer and partially reflected at the interface so that two peaks corresponding to the reflected lights from the inner surface and the interface are observed when the reflected lights are measured by a laser displacement gauge provided in the internal ranging section, wherein the internal ranging section is moved closer to or away from the inner surface and/or the internal ranging section is tilted to alter the outgoing direction of the laser light so as to search a position and an angle which allows the observation of the two peaks;

moving an external ranging section along an outer surface of all portions of the vitreous silica crucible constituted by the sidewall portion, the corner portion, and the mortar-shaped bottom portion, in a contactless manner;

measuring a distance between the external ranging section and the outer surface as a distance from the outer surface, by subjecting the outer surface of the crucible to irradiation with laser light and then detecting a reflected light from the outer surface, the laser light being emitted from the external ranging section in an oblique direction with respect to the outer surface, and the measurement being conducted at a plurality of measuring points along a course of a movement of the external ranging section, wherein the plurality of measuring points include points at the sidewall portion, the corner portion, and the bottom portion;

obtaining a three-dimensional shape of the outer surface of the crucible, by associating three-dimensional coordinates of each of the measuring points with the distance from the outer surface;

determining a shape of the crucible based on the three-dimensional shape of the inner surface and the three-dimensional shape of the outer surface of the crucible; and evaluating the crucible based on whether the shape of the crucible determined from the three-dimensional shape of the inner surface and the three-dimensional shape of the outer surface is a shape within a range defined as being between a shape of a crucible having minimum thickness satisfying a predetermined dimension tolerance and a shape of a crucible having maximum thickness satisfying the predetermined dimension tolerance.

2. The method of claim 1, wherein an angle of incidence of the laser light emitted from the internal ranging section is 30 to 60 degrees with respect to the inner surface.

3. The method of claim 1, wherein the internal ranging section is fixed to an internal robot arm configured to move the internal ranging section in a three-dimensional manner.

4. The method of claim 3, wherein the crucible is placed so as to cover the internal robot arm.

5. The method of claim 1, wherein the external ranging section is fixed to an external robot arm configured to move the external ranging section in a three-dimensional manner.

6. The method of claim 1, further comprising the step of:
determining a three-dimensional distribution of an infrared absorption spectrum by measuring the infrared absorption spectrum at a plurality of measuring points on the three-dimensional shape of the inner surface.

7. The method of claim 1, further comprising the step of:
determining a three-dimensional distribution of a Raman spectrum by measuring the Raman spectrum at a plurality of measuring points on the three-dimensional shape of the inner surface.

8. The method of claim 1, further comprising the step of:
determining a three-dimensional distribution of a bubble distribution by measuring the bubble distribution at a sidewall of the crucible corresponding to each of a plurality of measuring points, the plurality of measuring points being arranged on the three-dimensional shape of the inner surface of the crucible.

9. The method of claim 8, wherein a bubble content rate is measured by using a confocal microscope.

10. The method of claim 1, further comprising the step of:
determining a three-dimensional distribution of a surface roughness of the inner surface by measuring the surface roughness at a plurality of measuring points on the three-dimensional shape of the inner surface.

11. A method of claim 1, further comprising the steps of:
moving an external ranging section along an outer surface of the vitreous silica crucible;
measuring a distance between the external ranging section and the outer surface as a distance from the outer surface, by subjecting the outer surface of the crucible to irradiation with laser light and then detecting a reflected light from the outer surface, the laser light being emitted from the external ranging section in an oblique direction with respect to the outer surface, and the measurement being conducted at a plurality of measuring points along a course of a movement of the external ranging section;
obtaining a three-dimensional shape of the outer surface of the crucible, by associating three-dimensional coordinates of each of the measuring points with the distance from the outer surface; and
determining a three-dimensional distribution of a surface roughness of the outer surface by measurement conducted at a plurality of measuring points on the three-dimensional shape of the outer surface.

12. The method of claim 10, wherein the surface roughness is measured by using a confocal microscope.

13. The method of claim 1, further comprising the step of:
determining a three-dimensional position of a foreign substance, by:
obtaining an image at each of a plurality of measuring points on the three-dimensional shape of the inner surface,
determining whether foreign substance is existing in the image, and
further obtaining a plurality of additional images at a point where the image with foreign substance had been taken, when it is determined that foreign substance is existing in the image, wherein the plurality of additional images are taken by shifting a focal point in the direction of thickness of the crucible.

14. The method of claim 13, wherein the three-dimensional position is determined by using a confocal microscope.

15. The method of claim 1, further comprising the step of:
determining a three-dimensional distribution of distortion, by taking an image at each of a plurality of measuring points on the three-dimensional shape of the inner surface.

16. The method of claim 1, wherein
the measurement of the three-dimensional shape of the inner surface is conducted by holding the crucible with a robot arm for conveyance to convey the crucible to a measuring area, and
the entire inner surface of the crucible is measured by repeating the steps of conducting a measurement for a particular position of the crucible with respect to a circumferential direction of the crucible by moving a tip of the internal robot arm between a bottom portion and an opening portion of the crucible and rotating the crucible by the robot arm for conveyance in the circumferential direction of the crucible.

17. The method of claim 16, wherein the crucible is rotated by the robot arm for conveyance by 6.3 degrees or less.

18. The method of claim 16, wherein
the robot arm for conveyance holds the crucible by a holding section, and
the holding section holds the crucible by pressing arms against a side surface of the crucible from at least four directions, each of the arms being provided with an elastic member at a surface which contacts the crucible.

19. A method for manufacturing a monocrystalline silicon, comprising the steps of:
filling a vitreous silica crucible with a polycrystalline silicon;
melting the polycrystalline silicon to give a silicon melt;
allowing a seed crystal to come in contact with the silicon melt; and
pulling the seed crystal; wherein
a condition for pulling a monocrystalline silicon is determined in accordance with a result obtained from claim 1.

20. The method of claim 19, wherein a height of a liquid surface of the silicon melt before the seed crystal contacts the silicon melt is determined in accordance with a mass of the polycrystalline silicon and the three-dimensional shape of the vitreous silica crucible.

21. The method of claim 19, wherein
the vitreous silica crucible comprises a cylindrical sidewall portion, a curved bottom portion, and a corner portion connecting the sidewall portion and the bottom portion, the curvature of the corner portion being larger than that of the bottom portion; and
the condition for pulling the monocrystalline silicon after the liquid surface of the silicon melt reaches the corner portion is determined in accordance with the three-dimensional shape of the inner surface of the vitreous silica crucible.

* * * * *